United States Patent
Hanson et al.

(10) Patent No.: US 12,426,494 B2
(45) Date of Patent: Sep. 23, 2025

(54) PHOTOMECHANICAL POLYMERS, COMPOSITIONS, AND METHODS

(71) Applicant: The Florida State University Research Foundation, Inc., Tallahassee, FL (US)

(72) Inventors: Kenneth Hanson, Tallahassee, FL (US); William Oates, Tallahassee, FL (US); Drake Beery, Tallahassee, FL (US); Eugenia Stanisauskis, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 437 days.

(21) Appl. No.: 18/189,461

(22) Filed: Mar. 24, 2023

(65) Prior Publication Data

US 2023/0309370 A1    Sep. 28, 2023

Related U.S. Application Data

(60) Provisional application No. 63/323,820, filed on Mar. 25, 2022.

(51) Int. Cl.
| | |
|---|---|
| *H10K 85/10* | (2023.01) |
| *C08G 73/06* | (2006.01) |
| *H10K 30/00* | (2023.01) |
| *H10K 101/10* | (2023.01) |

(52) U.S. Cl.
CPC ....... *H10K 85/141* (2023.02); *C08G 73/0672* (2013.01); *H10K 30/671* (2023.02); *H10K 2101/10* (2023.02)

(58) Field of Classification Search
None
See application file for complete search history.

(56) References Cited

PUBLICATIONS

Barrett et al., Photo-mechanical effects in azobenzene-containing soft materials, Soft Matter 2007, 3 (10), 1249-1261.
Bizier et al., An Alternative Role for Acetylenes: Activation of Fluorobenzenes toward Nucleophilic Aromatic Substitution, J. Org. Chem. 2013, 78 (12), 5987-5998.
Das et al., Bimetallic Catalysis Involving Dipalladium(I) and Diruthenium(I) Complexes, Chem. Eur. J. 2010, 16 (48), 14459-14468.
Hahm et al., UV-Driven Switching of Chain Orientation and Liquid Crystal Alignment in Nanoscale Thin Films of a Novel Polyimide Bearing Stilbene Moieties in the Backbone, J. Phys. Chem. B 2008, 112 (16), 4900-4912.
Hammond et al., Mechanisms of Photochemical Reactions in Solution. XXII. Photochemical cis-trans Isomerization, J. Am. Chem. Soc. 1964, 86 (16), 3197-3217.

(Continued)

*Primary Examiner* — Anthony Ho
(74) *Attorney, Agent, or Firm* — Eversheds Sutherland (US) LLP

(57) ABSTRACT

Photopolymers, monomers, compositions including photopolymers and a dopant, and methods, including methods for eliciting a photomechanical response. The dopant may be a triplet sensitizing dopant. The exposing of compositions to the one or more wavelengths of electromagnetic radiation may elicit a photomechanical response via a triplet excited state mechanism.

20 Claims, 15 Drawing Sheets

(56) References Cited

PUBLICATIONS

Ikeda et al., Photochemical switching of polarization in ferroelectric liquid-crystal films, Nature 1993, 361 (6411), 428-430.
Kondo, M., Photomechanical materials driven by photoisomerization or photodimerization, Polym. J. 2020, 52 (9), 1027-1034).
Kundys, B., Photostrictive materials, Appl. Phys. Rev. 2015, 2 (1), 011301.
Orlandi et al., Triplet Energy Transfer to cis and trans Stilbene. A Quantum Mechanical Approach, Chem. Phys. 1980, 52 (3), 313-319.
Saltiel et al., The Triplet State in Stilbene cis-trans Photoisomerization, Pure Appl. Chem. 1975, 41 (4), 559-579.
Waldeck, D. H., Photoisomerization Dynamics of Stilbenes, Chem. Rev. 1991, 91 (3), 415-436.
White et al., Polarization-controlled, photodriven bending in monodomain liquid crystal elastomer cantilevers, J. Mater. Chem. 2009, 19 (8), 1080-1085.

PHOTOMECHANICAL POLYMERS, COMPOSITIONS, AND METHODS

CROSS-REFERENCE TO RELATED APPLICATIONS

This application claims priority to U.S. Provisional Patent Application No. 63/323,820, filed Mar. 25, 2022, which is incorporated by reference herein.

STATEMENT REGARDING FEDERALLY SPONSORED RESEARCH OR DEVELOPMENT

This invention was made with government support under Contract No. DMR-1750825, awarded by the National Science Foundation. The government has certain rights in this invention.

BACKGROUND

Stimuli-responsive materials can be useful in a broad range of adaptive structure applications, such as robotics, aerospace engineering, drug delivery, heliostats, etc. Piezoelectric ceramics, magnetostrictive materials, and shape memory alloys are well known for their use in such applications.

Photoresponsive polymers are another class of adaptive materials that can exhibit spatial and temporal shape changes dictated by the location and intensity of irradiation (see, e.g., Kundys, B., *Appl. Phys. Rev.* 2015, 2 (1), 011301; Barrett, C. J. et al. Ikeda, T., *Soft Matter* 2007, 3 (10), 1249-1261; and Kondo, M., *Polym. J.* 2020, 52 (9), 1027-1034). These polymer materials can be controlled using a remote source, like a laser, without the need for a tethered electric circuit or power supply. Unfortunately, the conversion of light into mechanical work is often energetically inefficient, and only small amounts of mechanical force are usually generated.

Most photomechanical polymers rely on light absorption and structural change of azobenzene molecules/monomers (see, e.g., White, T. J. et al. *J. Mater. Chem.* 2009, 19 (8), 1080-1085). That is, under ultraviolet (UV) (<400 nm) and deep-blue light (400-450 nm), azobenzene can undergo a well-known trans-to-cis and cis-to-trans isomerization, respectively (see, e.g., Ikeda, T. et al. *Nature* 1993, 361 (6411), 428-430). When incorporated into a polymer matrix, anisotropic trans-cis-trans photoisomerization can translate to a bulk mechanical response from the polymer film.

Stilbene, the carbon-based analogue of azobenzene, can also undergo photoinduced trans-cis-trans isomerization (see, e.g., Waldeck, D. H., et al. *Chem. Rev.* 1991, 91 (3), 415-436).

Yet, despite having a higher activation barrier for isomerization and the potential to increase the amount of mechanical force, stilbene-based polymers have not been used as photomechanical films, likely due, at least in part, to the significantly hypsochromically shifted absorption of stilbene relative to azobenzene, which can require UV light to generate the singlet excited state and elicit a response. The need for UV light can limit any potential utility of a stilbene photopolymer, because the use of UV light requires expensive LEDs/lasers, the solar spectrum includes small UV contribution, and/or the high energy of UV light can damage both the chromophore and the polymer backbone.

There remains a need for photomechanical polymers that overcome one or more of these disadvantages, such as photomechanical polymers that generate greater forces, provide a mechanical response when irradiated with relatively low energy light, or a combination thereof.

BRIEF SUMMARY

Provided herein are embodiments of photopolymers that may react through a triplet excited state, which may provide a low energy light harvesting mechanism. A desirable mechanical response may be achieved through a triplet excited state, which can be accessed via doping with a triplet sensitizer. In some embodiments, a triplet sensitizing dopant (e.g., a molecular dopant or quantum dot) is dispersed in the photopolymers described herein. The use of a triplet sensitizer dopant may permit the use of monomers, such as stilbene-based monomers, which can elicit a stronger mechanical response.

In one aspect, compositions are provided. In some embodiments, the compositions include a photopolymer, and a dopant dispersed in the photopolymer. The photopolymer may include at least one stilbene-based monomer. The dopant may include a triplet excited state sensitizing dopant. The dopant may be a molecular dopant, a quantum dot, or a combination thereof. The dopant may be present at any amount in the compositions, but, in some embodiments, a mole ratio of a stilbene-based monomer to a dopant in a composition is about 1:0.01 to about 1:0.5. In some embodiments, the photopolymer includes a stilbene-based monomer having the following structure prior to polymerization—

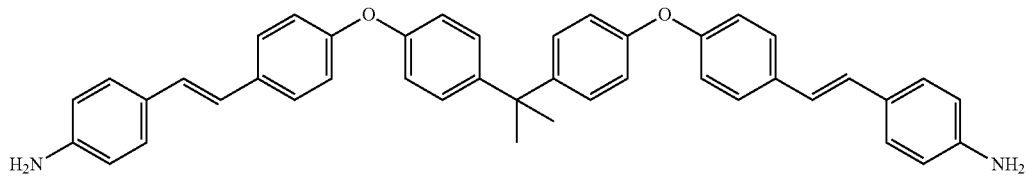 [SMILES: CC(C)(c1ccc(Oc2ccc(/C=C/c3ccc(N)cc3)cc2)cc1)c1ccc(Oc2ccc(/C=C/c3ccc(N)cc3)cc2)cc1]

The dopant may include an iridium(III) cyclometallated sensitizer.

In another aspect, methods of eliciting a photomechanical response are provided. In some embodiments, the methods include providing a composition as described herein, and irradiating the composition with one or more wavelengths of electromagnetic radiation effective to elicit the photomechanical response of the composition. The photomechanical response may include a bending of the composition, a constriction of the composition, or a combination thereof. The one or more wavelengths of electromagnetic radiation may include a wavelength within the visible spectrum.

In yet another aspect, compounds, such as stilbene-based monomers, are provided herein.

Additional aspects will be set forth in part in the description which follows, and in part will be obvious from the description, or may be learned by practice of the aspects described herein. The advantages described herein may be realized and attained by means of the elements and combinations particularly pointed out in the appended claims. It is to be understood that both the foregoing general description and the following detailed description are exemplary and explanatory only and are not restrictive.

DETAILED DESCRIPTION

Figure 1:
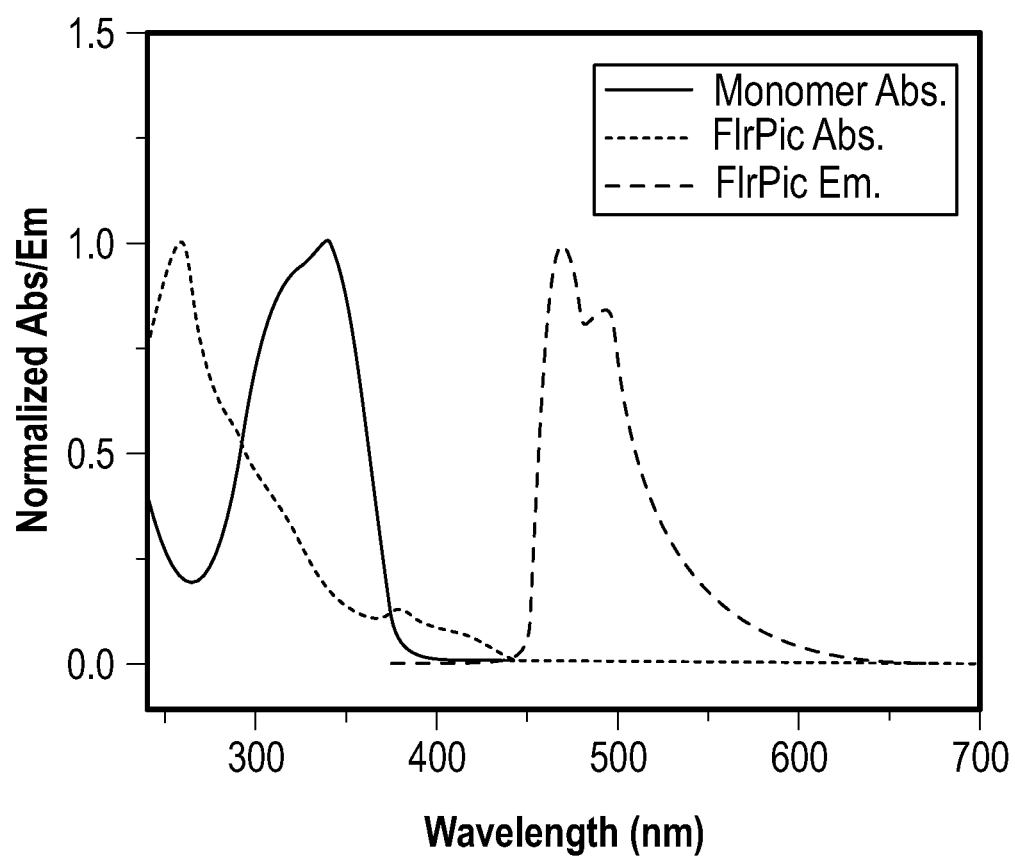
FIG. 1 depicts normalized absorbance and emission spectra for an embodiment of a stilbene monomer, and an embodiment of a sensitizer.

Provided herein are compounds, such as monomers, compositions, which may include a photopolymer and a dopant, and methods of eliciting a photomechanical response from a composition, such as those described herein.

Compositions

The compositions described herein may include a photopolymer, and a dopant dispersed in the photopolymer.

The compositions generally may be in any physical form. In some embodiments, the compositions are in the form of a film, such as a thin film (i.e., a film having a thickness of 1 mm or less). When a composition is in the form of a film, the film may have a thickness of about 10 micrometers to about 50 micrometers, about 15 micrometers to about 40 micrometers, about 20 micrometers to about 30 micrometers, or about 25 micrometers.

Photopolymers

As used herein, the term "photopolymer" refers to a polymer that is capable of exhibiting a photomechanical response when irradiated with one or more wavelengths of electromagnetic radiation. The term "polymer" refers to a macromolecule formed by covalently bonding at least two monomers together, wherein the at least two monomers are the same type of monomer or different types of monomers; therefore, the term "polymer" includes homopolymers, copolymers (e.g., terpolymers, etc.), oligomers, etc. of any configuration, e.g., linear, branched, crosslinked, comb, star, etc.

A photomechanical response (e.g., a spatial and/or temperature shape change) of a photopolymer may be dictated, at least in part, by (i) the wavelength(s) of electromagnetic radiation used to irradiate a composition, (ii) the location of a source of the electromagnetic radiation relative to a composition (e.g., when a composition is in the form of a film, a source of electromagnetic radiation may be arranged in a manner that permits the waves of electromagnetic radiation to travel in a direction that is perpendicular and/or parallel to a longitudinal axis of the film), (iii) the intensity of the electromagnetic radiation, or (iv) a combination thereof.

The photopolymers generally may have any molecular weight ($M_n$ and/or $M_w$), especially any molecular weight that does not negatively impact a desired photomechanical response. In some embodiments, the molecular weight ($M_n$) of the photopolymer is about 1,000 g/mol to about 10,000,000 g/mol, about 1,000 g/mol to about 7,500,000 g/mol, about 1,000 g/mol to about 5,000,000 g/mol, about 1,000 g/mol to about 2,500,000 g/mol, about 1,000 g/mol to about 1,000,000 g/mol, about 1,000 g/mol to about 500,000 g/mol, about 1,000 g/mol to about 250,000 g/mol, or about 1,000 g/mol to about 100,000 g/mol.

In some embodiments, the photopolymers include at least one stilbene-based monomer. The photopolymers "include at least one stilbene-based monomer" when the photopolymer is formed by a polymerization of the at least one stilbene-based monomer, optionally in the presence of a comonomer other than the at least one stilbene-based monomer. As used herein, the phrase "stilbene-based monomer" refers to any polymerizable monomer and/or end group that includes at least one unsubstituted or substituted stilbene moiety. A stilbene moiety, for example, may be substituted with a functional group, such as an amine, that can react with another monomer to form a photopolymer. In some embodiments, the at least one stilbene-based monomer includes one unsubstituted or substituted stilbene moiety. In some embodiments, the at least one stilbene-based monomer includes two unsubstituted or substituted stilbene moieties. Two or more unsubstituted or substituted stilbene moieties may be covalently bonded to each other directly, or via one or more linking moieties. The linking moieties may be selected to enhance, or at least not undesirably impact, the ability of a photopolymer to achieve a desired photomechanical response.

In some embodiments, the at least one stilbene-based monomer has the following structure when in an unpolymerized state:

UV light is typically necessary for isomerization via the singlet excited state ($S_1$), stilbene and derivatives thereof (e.g., a stilbene-based monomer as described herein) can isomerize via the much lower energy triplet excited state ($T_1$) manifold (see, e.g., Hammond, G. S. et al. *J. Am. Chem. Soc.* 1964, 86 (16), 3197-3217; Saltiel, J. et al. *Pure Appl. Chem.* 1975, 41 (4), 559-579; and Orlandi, G. et al. *Chem. Phys.* 1980, 52 (3), 313-319). While the ground to triplet excited state transition ($S_0 \rightarrow T_1$) is typically forbidden, the $T_1$ state can be accessed in embodiments of the compositions described herein, and this may occur through energy transfer from a triplet sensitizer. Therefore, dispersing a triplet excited state sensitizing dopant in a photopolymer, as described herein, may permit the use of lower energy light to achieve a photomechanical response, increase the depth of light penetration, decrease the photodegradation of the composition, such as a composition in the form of a film, or a combination thereof. In some embodiments, compositions described herein, such as those in the form of a film, exhibit

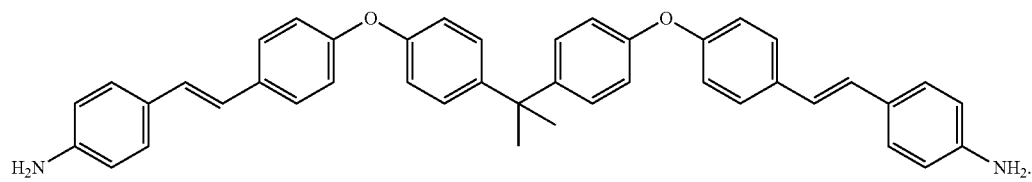 [SMILES: CC(C)(c1ccc(Oc2ccc(/C=C/c3ccc(N)cc3)cc2)cc1)c1ccc(Oc2ccc(/C=C/c3ccc(N)cc3)cc2)cc1]

Although this structure is depicted in an unpolymerized state for convenience, it is to be understood that the structure may be altered when the monomer is polymerized to form a photopolymer, as evidenced, for example, by the embodiments of photopolymer structures provided herein.

When a photopolymer is a copolymer, the photopolymer may include at least one stilbene-based monomer and a comonomer. The comonomer may be any monomer that is capable of forming a polymer, and may be selected to enhance, or at least not undesirably impact, the ability of a photopolymer to achieve a desired photomechanical response. In some embodiments, the comonomer is a dianhydride monomer.

In some embodiments, the photopolymer is a polyimide photopolymer. As used herein, the phrase "polyimide photopolymer" refers to a photopolymer that includes at least one imide moiety in two or more repeat units of the photopolymer. For example, a polyimide photopolymer may be formed by contacting (i) at least one stilbene-based monomer that includes two amine functional groups, and (ii) a dianhydride, such as 4,4'-oxidiphthalic anhydride. In some embodiments, the photopolymer is a polyimide photopolymer of the following formula, wherein n is any suitable number, such as 2 to 100,000, 2 to 75,000, 2 to 50,000, 2 to 25,000, 2 to 15,000, 2 to 10,000, or 2 to 5,000:

polarization dependent movement (e.g., bending) when irradiated with electromagnetic radiation (such as visible light) via sensitizer excitation, triplet energy transfer, stilbene isomerization, monomer reorientation, or a combination thereof.

The dopants, including the triplet excited state sensitizing dopants, that are present in the compositions described herein may include molecular dopants, quantum dots, or a combination thereof. In some embodiments, the dopant includes an iridium(III) cyclometallated sensitizer. In some embodiments the dopant is as bis[2-(4,6-difluorophenyl)pyridinato-$C^2$,N](picolinato) iridium(III).

In some embodiments, the dopant is substantially uniformly dispersed in a photopolymer. In some embodiments, the dopant is unevenly dispersed in a photopolymer. The dopant may be dispersed in a photopolymer in any manner. For example, a dopant may be present in a liquid in which a polymerization reaction occurs, wherein the polymerization reaction forms a photopolymer. As a further example, a photopolymer may be formed or provided, and then a dopant may be dispersed in the already formed or provided photopolymer.

A dopant may be present at any effective amount in the compositions described herein. In some embodiments, a mole ratio of a stilbene-based monomer of a photopolymer

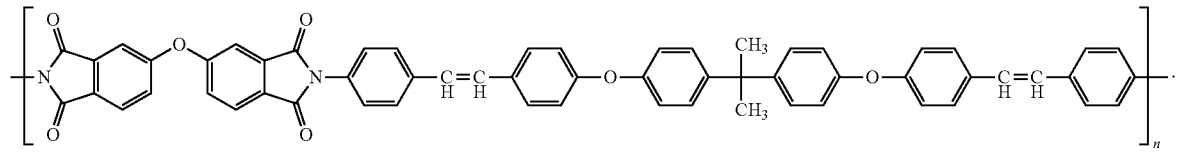

Dopants

The dopants that are present in the compositions may include a triplet excited state sensitizing dopant. Although to the dopant in a composition is about 1:0.01 to about 1:1, about 1:0.01 to about 1:0.75, about 1:0.01 to about 1:0.5, about 1:0.01 to about 1:0.25, or about 1:0.01 to about 1:0.1

(stilbene-based monomer:dopant). In some embodiments, a mole ratio of a photopolymer to the dopant in a composition is about 1:0.01 to about 1:1, about 1:0.01 to about 1:0.75, about 1:0.01 to about 1:0.5, about 1:0.01 to about 1:0.25, or about 1:0.01 to about 1:0.1 (photopolymer:dopant).

In some embodiments, a dopant is present in a composition at an amount of about 1 mol % to about 20 mol %, about 5 mol % to about 15 mol %, about 8 mol % to about 12 mol %, or about 10 mol %, relative to the at least one stilbene-based monomer. In some embodiments, a dopant is present in a composition at an amount of about 1 mol % to about 20 mol %, about 5 mol % to about 15 mol %, about 8 mol % to about 12 mol %, or about 10 mol %, relative to the photopolymer.

Methods

In another aspect, methods of eliciting a photomechanical response are provided. In some embodiments, the methods include providing a composition, such as a composition described herein; and irradiating the composition with one or more wavelengths of electromagnetic radiation. The one or more wavelengths of electromagnetic radiation may be effective to elicit a photomechanical response of the composition.

The "photomechanical response" may include any physical change of a composition that is elicited by irradiating the composition with one or more wavelengths of electromagnetic radiation. A physical change may include displacement of a composition from a starting position, such as by bending, constriction, etc.

The one or more wavelengths of electromagnetic radiation may include any one or more wavelengths that is/are effective to elicit a photomechanical response of a composition. In some embodiments, the one or more wavelengths of electromagnetic radiation include at least one wavelength within the visible spectrum. In some embodiments, the one or more wavelengths of electromagnetic radiation include one or more wavelengths of about 400 nm to about 450 nm, about 410 nm to about 450 nm, about 420 nm to about 450 nm, about 430 nm to about 450 nm, or about 440 nm to about 450 nm.

A composition may be irradiated with one or more wavelengths of electromagnetic radiation for any length of time, such as a length of time that is effective to achieve a desired photomechanical response. In some embodiments, a composition is irradiated with one or more wavelengths of electromagnetic radiation for about 1 second to about 1,000 seconds, about 1 second to about 750 seconds, about 1 second to about 500 seconds, about 1 second to about 250 seconds, about 1 second to about 100 seconds, about 1 second to about 75 seconds, about 1 second to about 50 seconds, or about 1 second to about 30 seconds.

When a composition is irradiated with one or more wavelengths of electromagnetic radiation, the electromagnetic radiation may be directed at any angle relative to the composition. During irradiation, the angle may be static or dynamic. In some embodiments, the electromagnetic radiation travels in a direction that is perpendicular to the composition, such as perpendicular to a surface of a film-shaped composition. In some embodiments, the electromagnetic radiation travels in a direction that is parallel to the composition, such as parallel to a surface of a film-shaped composition. The angle relative to the composition may be selected to achieve a desired result, such as a particular physical change of a composition, a reduced processing time, etc.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of various embodiments, applicants in no way disclaim these technical aspects, and it is contemplated that the present disclosure may encompass one or more of the conventional technical aspects discussed herein.

The present disclosure may address one or more of the problems and deficiencies of known methods and processes. However, it is contemplated that various embodiments may prove useful in addressing other problems and deficiencies in a number of technical areas. Therefore, the present disclosure should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

In the descriptions provided herein, the terms "includes," "is," "containing," "having," and "comprises" are used in an open-ended fashion, and thus should be interpreted to mean "including, but not limited to." When photopolymers, compositions, and methods are claimed or described in terms of "comprising" various steps or photopolymers, compositions, and methods can also "consist essentially of" or "consist of" the various steps or components, unless stated otherwise.

The terms "a," "an," and "the" are intended to include plural alternatives, e.g., at least one. For instance, the disclosure of "a photopolymer", "a dopant", and the like, is meant to encompass one, or mixtures or combinations of more than one photopolymer, dopant, and the like, unless otherwise specified.

Various numerical ranges may be disclosed herein. When Applicant discloses or claims a range of any type, Applicant's intent is to disclose or claim individually each possible number that such a range could reasonably encompass, including end points of the range as well as any sub-ranges and combinations of sub-ranges encompassed therein, unless otherwise specified. Moreover, all numerical end points of ranges disclosed herein are approximate. As a representative example, Applicant discloses, in some embodiments, the one or more wavelengths of electromagnetic radiation are about 440 nm to about 450 nm. This range should be interpreted as encompassing about 440 nm and 450 nm, and further encompasses "about" each of 441 nm, 442 nm, 443 nm, 444 nm, 445 nm, 446 nm, 447 nm, 448 nm, and 449 nm, including any ranges and sub-ranges between any of these values.

As used herein, the term "about" means plus or minus 10% of the numerical value of the number with which it is being used.

EXAMPLES

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

Example 1—Preparation of Doped Photopolymer

An iridium(III) cyclometallated sensitizer was incorporated into a stilbene-polyimide based film, which permitted 1) the harnessing of lower energy light (445 nm), 2) triplet energy transfer (TET) from the sensitizer to stilbene, 3) isomerization of stilbene via the triplet excited state, and 4) a photomechanical response from the polymer films.

Particularly notable was that the direction of film bending was controlled with the polarization of incident light, which indicated that anisotropic excited states were retained through the sensitization mechanism. This behavior strongly suggested trans-cis-trans photoisomerization in comparison to the more widely observed trans-cis photoisomerization process.[15]

The stilbene-based polyimide polymer studied in this example had the following structure:

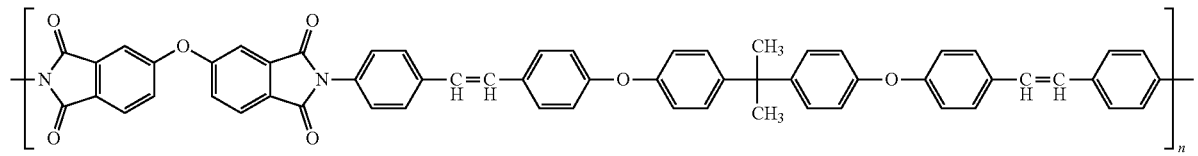

The iridium sensitizer studied in this example was iridium (III)bis[2-(4,6-difluorophenyl)pyridinato-C2,N](picolinato) (FIrPic).

FIG. 1 depicts normalized absorbance and emission spectra for the stilbene monomer of this example and FIrPic sensitizer in DCM. Pictures were also taken of the polymer films, both without (control) and with (sensitized) FIrPic doping.

The foregoing polymer was targeted in this example, because it is the stilbene analogue of a known azobenzene polyimide photomechanical polymer.[7] The sensitizer molecule of this example, again, was iridium(III)bis[2-(4,6-difluorophenyl)pyridinato-C2,N](picolinato), which may be referred to herein as FIrPic.

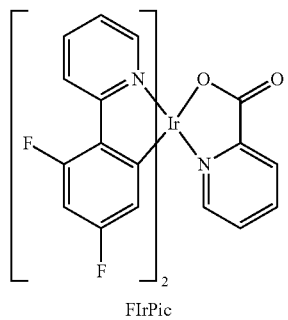

FIrPic

Figure 2:
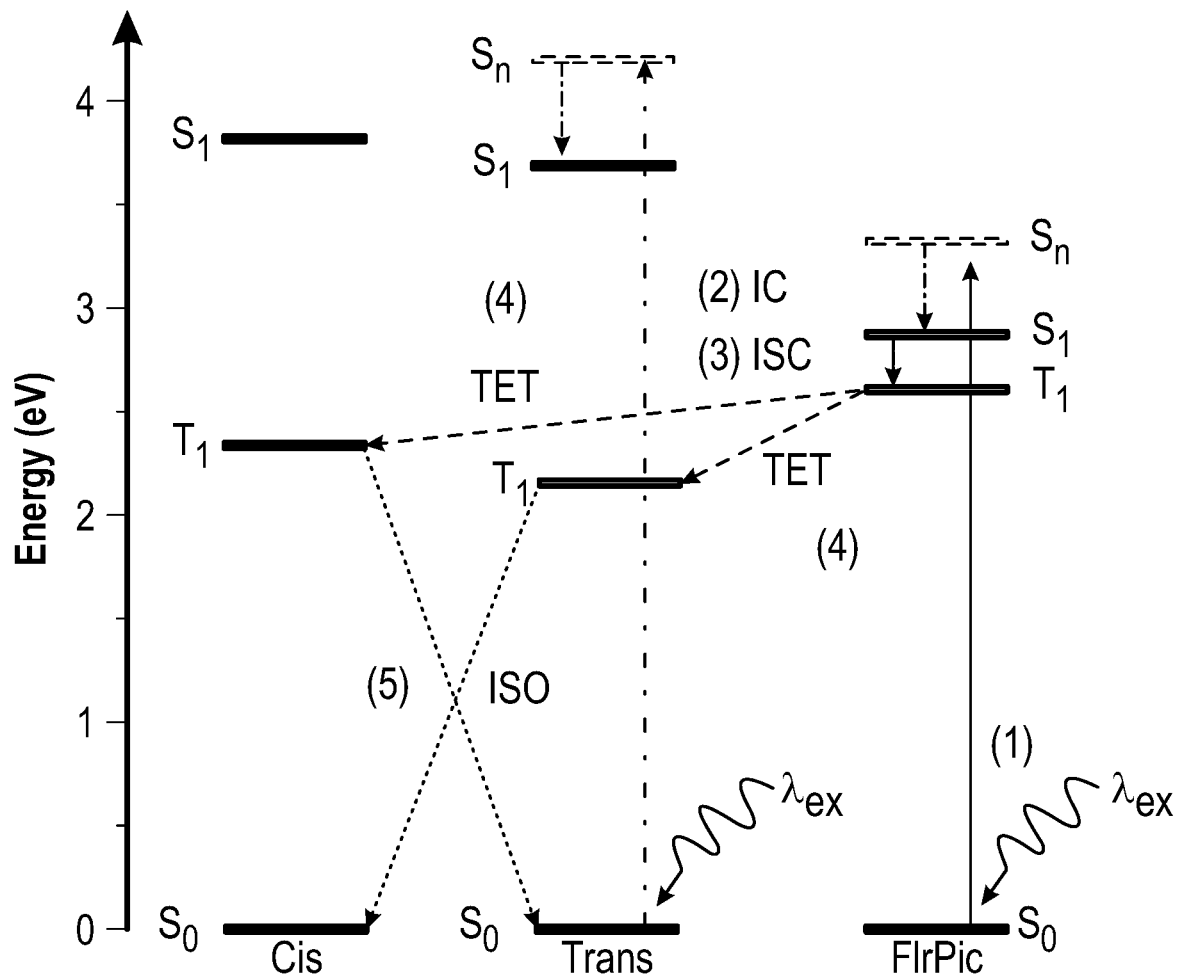
FIG. 2 depicts an energy diagram and dynamic events for an embodiment of a polymer film that includes an embodiment of a stilbene monomer, and an embodiment of a sensitizer.
Figure 2:
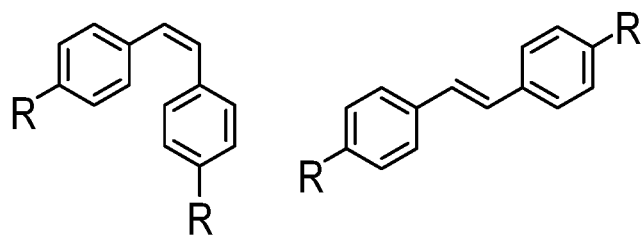

FIrPic was selected because (i) it is commercially available, (ii) it has absorption features that extend into the visible region (see FIG. 1), (iii) iridium cyclometallated complexes are known to undergo fast intersystem crossing with an ~100% triplet yield, and (iv) its triplet energy (2.65 eV)[16] is sufficiently high to favor TET to stilbene (2.14 eV)[17] as shown at FIG. 2.

FIG. 2 depicts an energy diagram and dynamic events for a polymer film containing a stilbene monomer and FIrPic sensitizer (IC=internal conversion, ISC=intersystem crossing; TET=triplet energy transfer, ISO=isomerization).

The stilbene monomer, 4,4'-((propane-2,2-diylbis(4,1-phenylene)bis(oxy)bis(4,1-phenylene))bis(ethylene-2,1-diyl))dianiline, was synthesized in three steps with an overall 15.6% yield. The polymer film was then prepared using an imide coupling reaction following a known procedure.[7] Briefly, 4,4;-oxidiphthalic anhydride was added to a dimethylacetamide solution containing the stilbene monomer and left to stir for 24 h. The viscous solution was then diluted and poured onto a glass slide and heated under vacuum at 50° C. for 1 h to remove the solvent before thermal imidization at 250° C. ATR-FTIR spectra of the diamine and dianhydride monomers as well as the film after thermal imidization were collected. The disappearance of the N—H stretch of the amine at 3500-3300 cm-1 and C=O stretch of the anhydride at 1845 cm$^{-1}$ as well as the appearance of a C=O stretch of bismaleimide at 1710 cm$^{-1}$ are consistent with the formation of imide bonds.

Attempts to determine the degree of polymerization (i.e., the molar mass) by NMR and SEC were unsuccessful due to the insoluble nature of the resulting film in all solvents tested (e.g., THF, DMF, DMSO). The absence of key signals in ATR-FTIR that corresponded to unreacted amine or anhydride functionalities in the films suggested that the extent of reaction was high. The degree of polymerization was not quantified, but a high extent of reaction indicated that at least modest molar mass was achieved (i.e., Carothers equation) and that a negligible amount of monomers remained. The films containing the sensitizer molecule were prepared following a similar procedure but with the addition of 10 mol % of FIrPic into the solution. The ATR-FTIR spectra were similar for both the sensitized and unsensitized films.

Both the sensitized and unsensitized films exhibited similar thickness (~25 μm; Table 1), and only a ~20° C. difference in the decomposition ($T_{d(unsen)}$=380° C.; $T_{d(sen)}$=360° C.), and glass transition ($T_{g(unsen)}$=210° C.; $T_{g(sen)}$=187° C.) temperatures (FIG. 3; FIG. 4A; FIG. 4B; Table 1).

TABLE 1

Summary of polyimide film properties.

| Sample | Thickness (μm) | $T_d$ (° C.)$^a$ | $T_g$ (° C.)$^b$ |
|---|---|---|---|
| Control | 25 ± 10 | 380 | 210 |
| Sensitized | 25 ± 10 | 360 | 187 |

$^a$Temperature at which 5% mass loss occurred.
$^b$Temperature obtained from midpoint.

Figure 3:
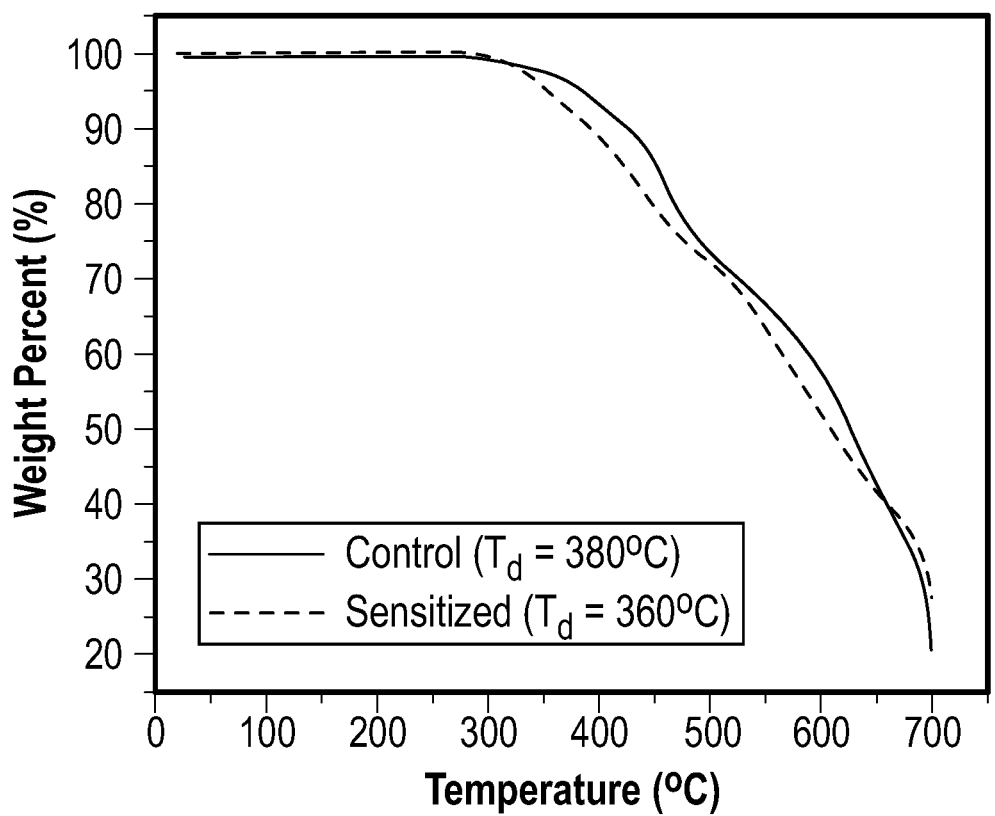
FIG. 3 depicts a thermogravimetric analysis of embodiments of control and sensitized films.
Figure 4A:
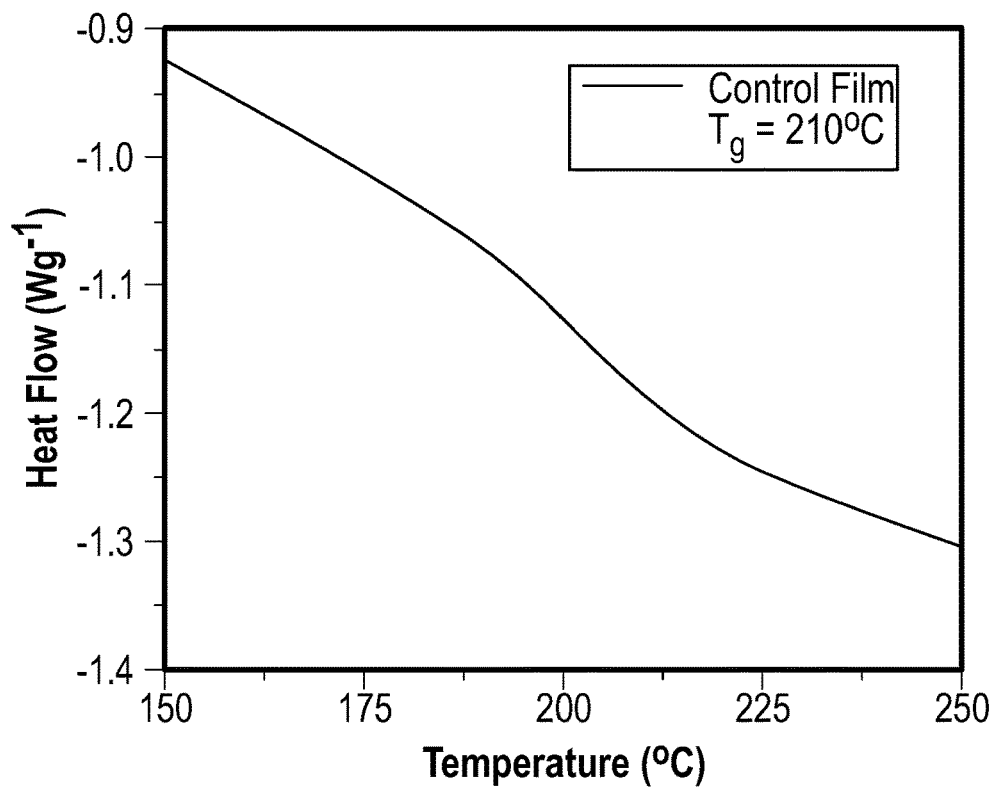
FIG. 4A and FIG. 4B depicts differential scanning calorimetry thermograms (exothermic going up) of embodiments of control and sensitized films, respectively.
Figure 4B:
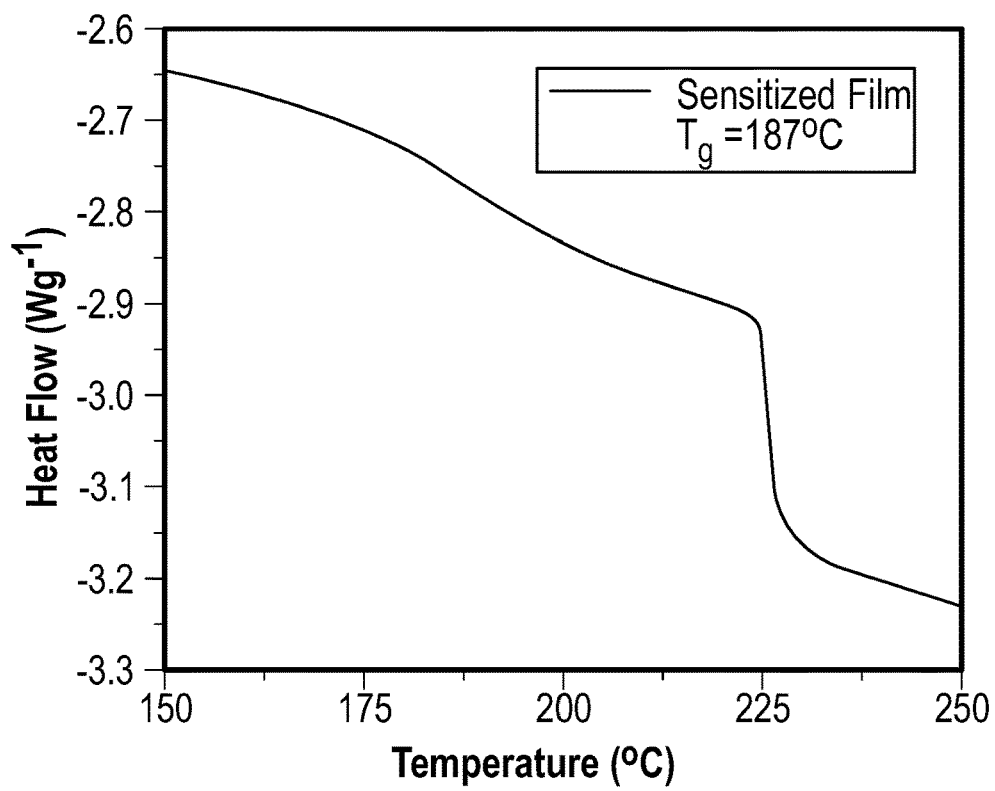

FIG. 3 depicts a thermogravimetric analysis of embodiments of control and sensitized films. Differential scanning calorimetry thermograms (exothermic going up) of embodiments of control and sensitized films are depicted at FIG. 4A and FIG. 4B, respectively.

Figure 5:
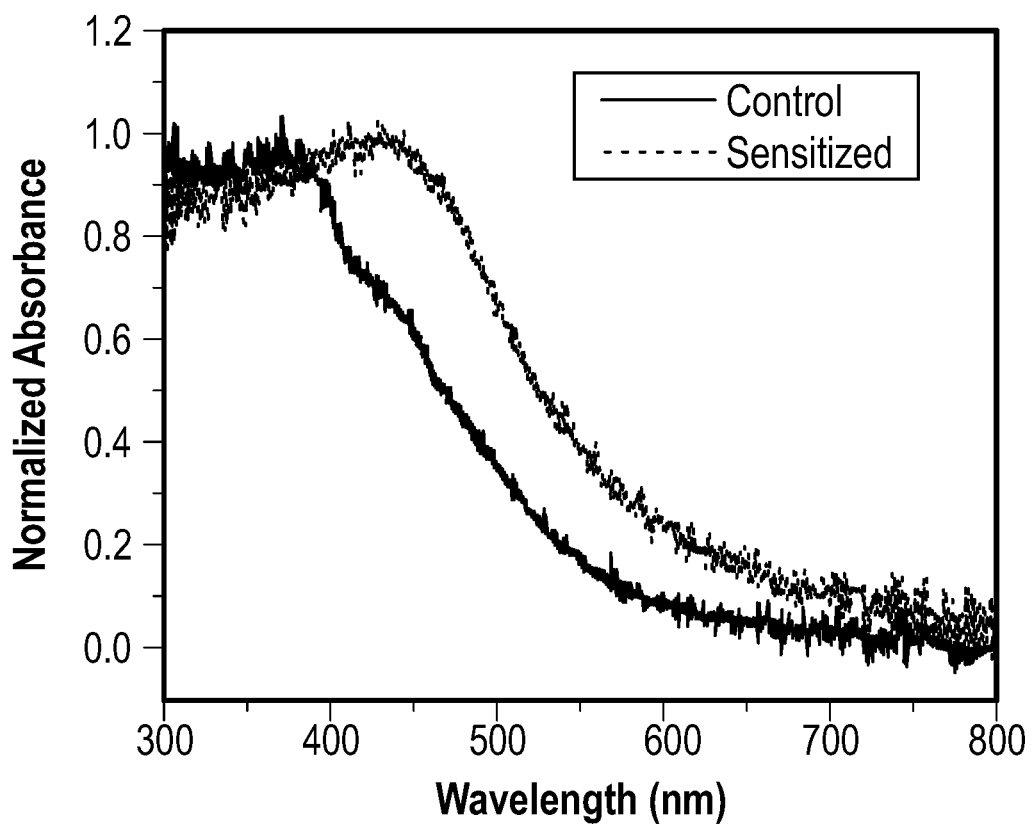
FIG. 5 depicts solid-state absorption spectra of control and sensitized polymer films.

These results indicated that FIrPic had minimal impact on the polymerization reaction or the film's thermal properties. The addition of FIrPic did, however, result in a readily observable color change due to the additional 400-450 nm absorption by the sensitizer molecule, which was observable from the solid-state absorption spectrum (FIG. 5). FIG. 5 depicts solid-state absorption spectra of control and sensitized polymer films. As an aside, in comparison to the analogous azobenzene polyimide polymer $T_g$ (276° C.) and $T_d$ (420° C.),[7] the stilbene polymer showed a lower $T_g$ (210° C.) and $T_d$ (380° C.).

Figure 6A:
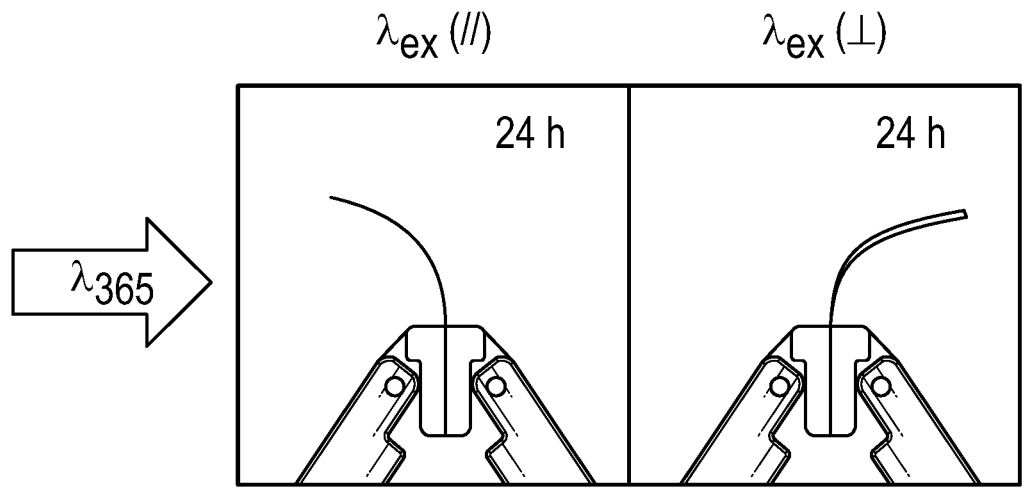
FIG. 6A depicts the effects of irradiating films for 24 hours with a particular wavelength of light directed parallel (left) or perpendicular (right) to the long-axis of the film.
Figure 6B:
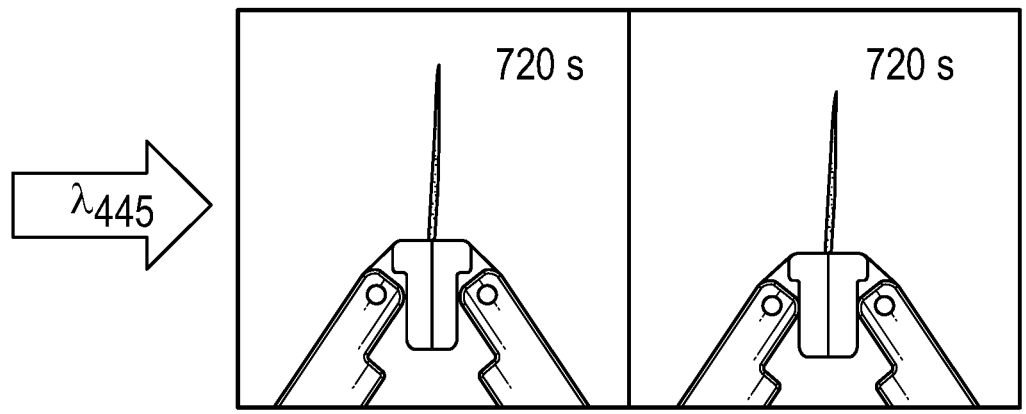
FIG. 6B depicts the effects of irradiating films for 720 seconds hours with a particular wavelength of light directed parallel (left) or perpendicular (right) to the long-axis of the film.
Figure 6C:
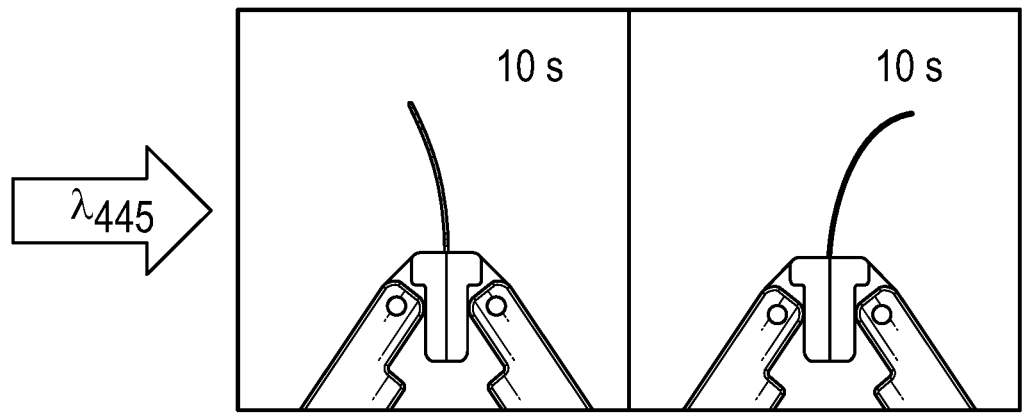
FIG. 6C depicts the effects of irradiating films for 10 seconds with a particular wavelength of light directed parallel (left) or perpendicular (right) to the long-axis of the film.

The films of this example were cut into 3×20 mm strips for photomechanical measurements. The strips were irradiated with 365 nm or 445 nm light and the response was monitored via photograph/video. The results are depicted at FIG. 6A, FIG. 6B, and FIG. 6C, which depicts the photomechanical responses of the control films under 365 nm (5 mW cm-2) (FIG. 6A), and 445 nm light (680 mW cm$^{-2}$) (FIG. 6B) polarized either parallel (left) or perpendicular (right) to the long-axis of the film. FIG. 6C depicts films under 445 nm light (680 mW cm$^{-2}$) polarized either parallel (left) or perpendicular (right) to the long-axis of the film.

Under vertical and horizontal 365 nm excitation (5 mW cm$^{-2}$), both the control and sensitized films bent towards and away from the light source, respectively (FIG. 6A). This response was similar to that observed with azobenzene photopolymers,[6] and was attributed to direct excitation of stilbene and subsequent trans-to-cis and cis-to-trans isomerization from the singlet excited state manifold. The film as prepared was isotropic but the polarized light preferentially excited the stilbene moieties with their transition moments aligned parallel to the incident light. Then, trans-cis-trans isomerization could occur until the stilbene moieties reoriented orthogonal to the excitation source and were no longer excitable. The bulk realignment of the stilbene units resulted in a surface contraction or expansion of the polymer under vertically and horizontally polarized light, respectively.[6, 22, 23]

Figure 7:
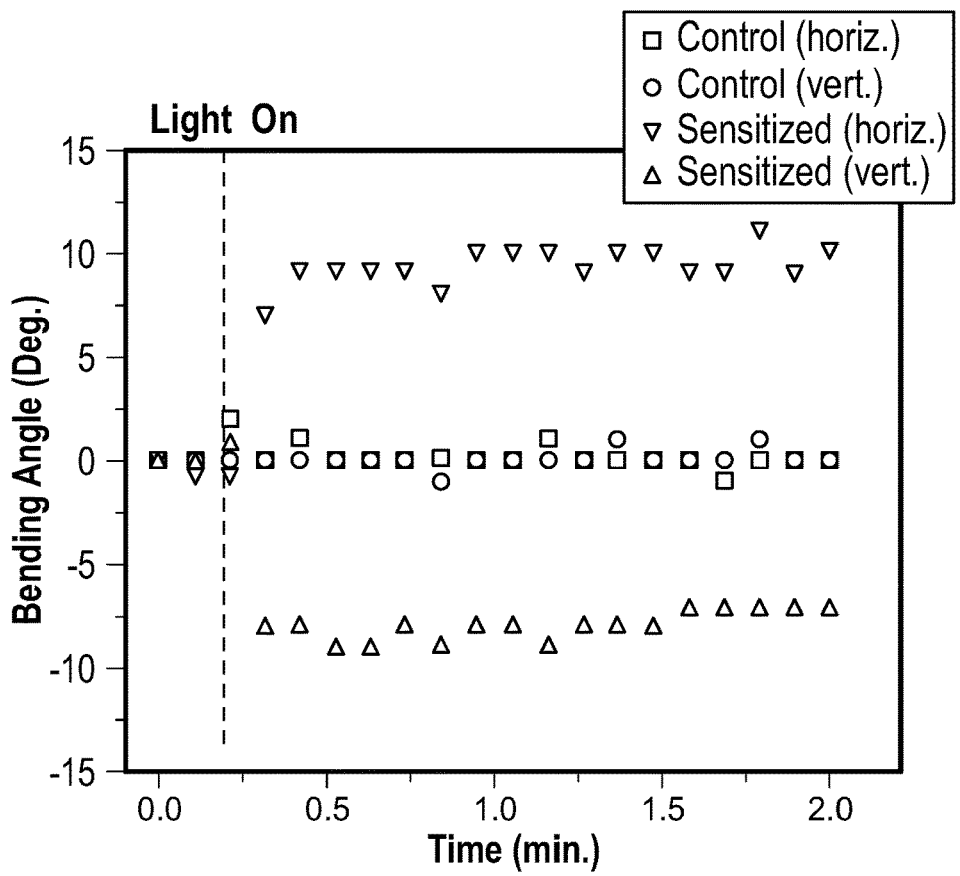
FIG. 7 depicts bending angles of embodiments of control and sensitized films.

Performing the same experiment but under 445 nm light resulted in no change with the control sample (i.e., no sensitizer) even over 720 s of irradiation with a much more intense light source (680 mW cm$^{-2}$) (FIG. 6B). The lack of response for the control film was not surprising given the nearly 100% transmittance (~0 absorbance) for the stilbene moiety at 445 nm (FIG. 1). However, under 445 nm excitation, the sensitized film bent towards and away from the vertically and horizontally polarized light, respectively. In fact, a >10° displacement from their respective starting positions was achieved in only 15 seconds of irradiation (FIG. 7). FIG. 7 depicts bending angles of embodiments of control and sensitized films with respect to time under horizontal and vertical light polarization ($\lambda_{ex}$=445 nm, 680 mW cm 2). Particularly notable was that although the excitation and isomerization events occurred on different species (i.e., the sensitizer and stilbene moiety, respectively), a polarization dependent response was still observed.

Figure 8:
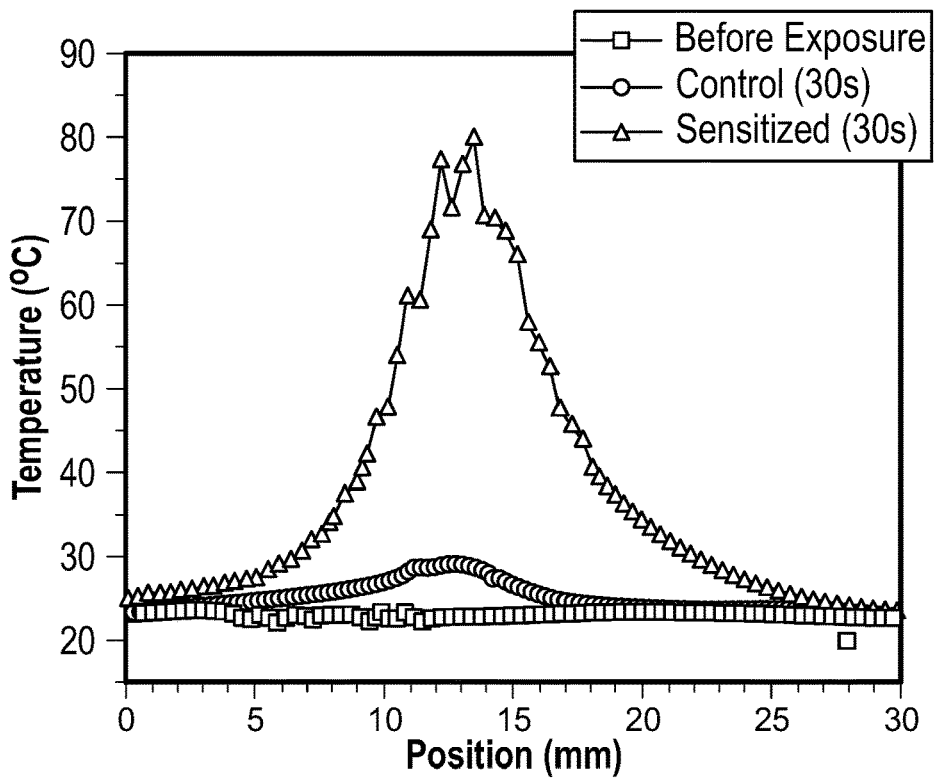
FIG. 8 depicts thermal infrared (IR) imaging of embodiments of control and sensitized films.

Thermal imaging indicated that there was a temperature increase of ~55° C. for the sensitized film, but minimal temperature change for the unsensitized film, after 30 seconds of 445 nm irradiation (FIG. 8). FIG. 8 depicts terminal IR imaging along the long axis of control and sensitized films of this example before and after 30 seconds of exposure to 445 nm light (680 mW cm$^{-2}$).

However, there were several indicators that thermal changes alone were not responsible for the mechanical response. First, the polarization dependent bending was analogous to the azobenzene polymers which was due to the well-known photoisomerization mechanism. Second, the process was thermally reversible where heating the films on a surface returned them to their un-deformed (flat) state that repeatedly bent under additional irradiation. Third, the same polarization dependent bending was observed when the film was mounted upside down, which indicated that the response was not due to film softening as observed when heated. Finally, the photo-induced temperature increase (55° C.) was well below the $T_g$ of the film (187° C.), which suggested that the transition to a rubbery, more flexible phase, did not occur under irradiation.

Figure 9A:
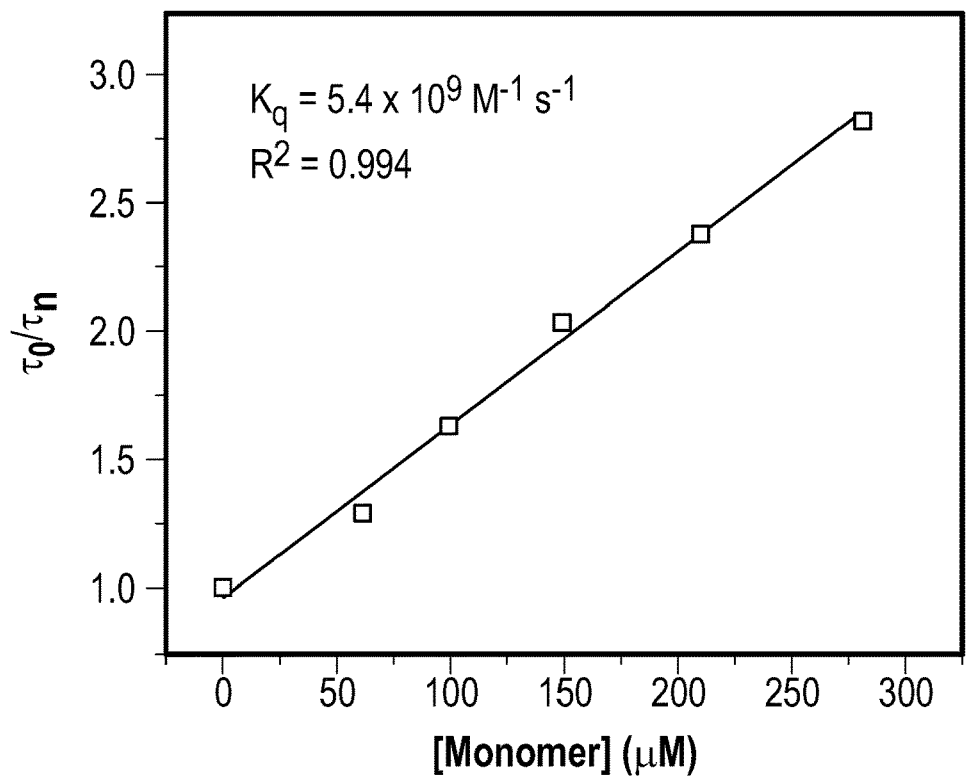
FIG. 9A depicts a Stern-Volmer plot for the excited state lifetime of an embodiment of dopant in an embodiment of a liquid versus the concentration of an embodiment of a stilbene monomer.
Figure 10:
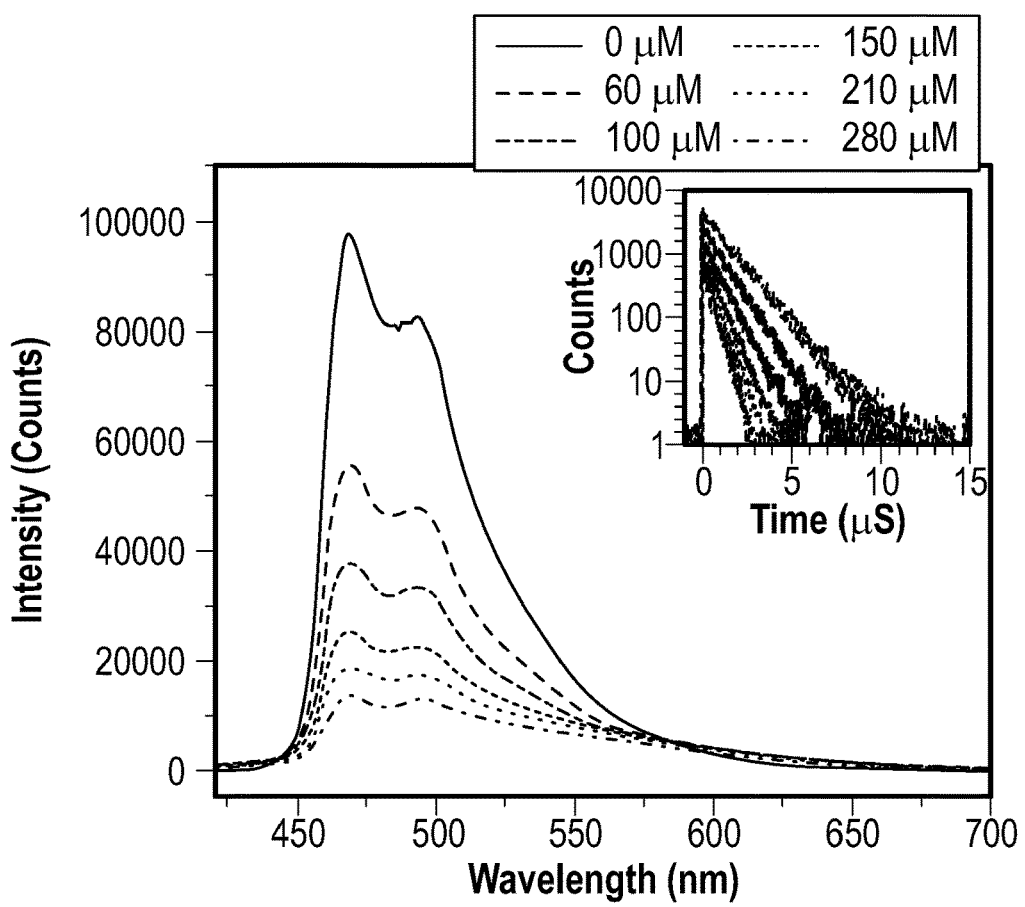
FIG. 10 depicts steady-state and time-resolved (inset) phosphorescence of an embodiment of a sensitizer.
Figure 11A:
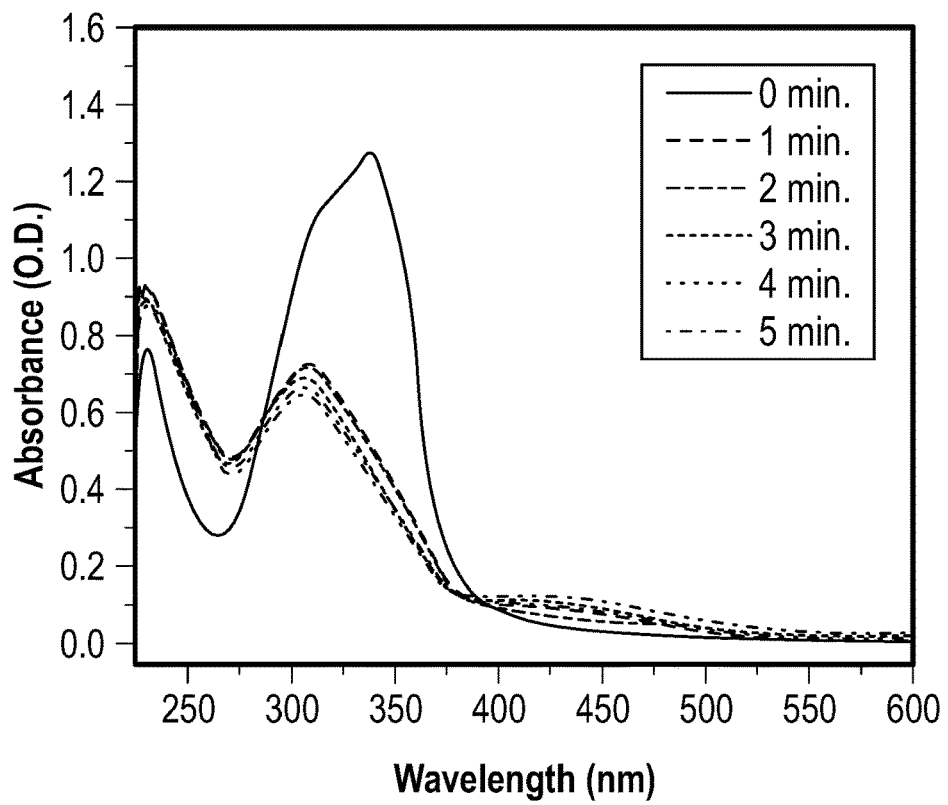
FIG. 11A, FIG. 11B, and FIG. 11C depict changes in absorbance over time for an embodiment of a compound at different wavelengths, and in the presence of an embodiment of a dopant.
Figure 11B:
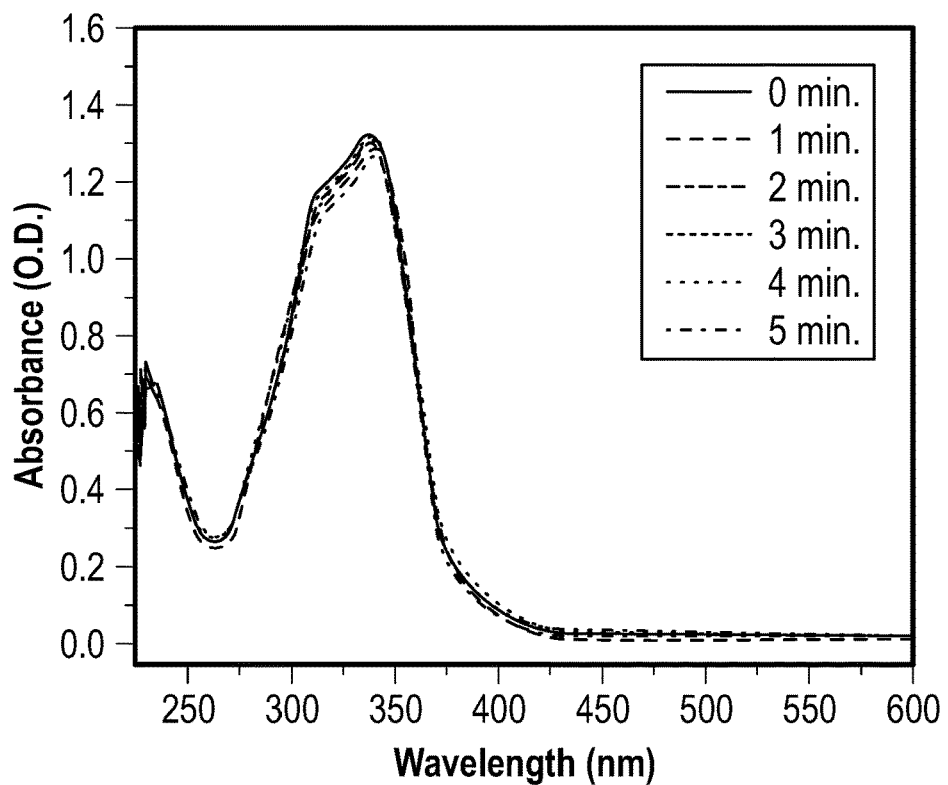
Figure 11C:
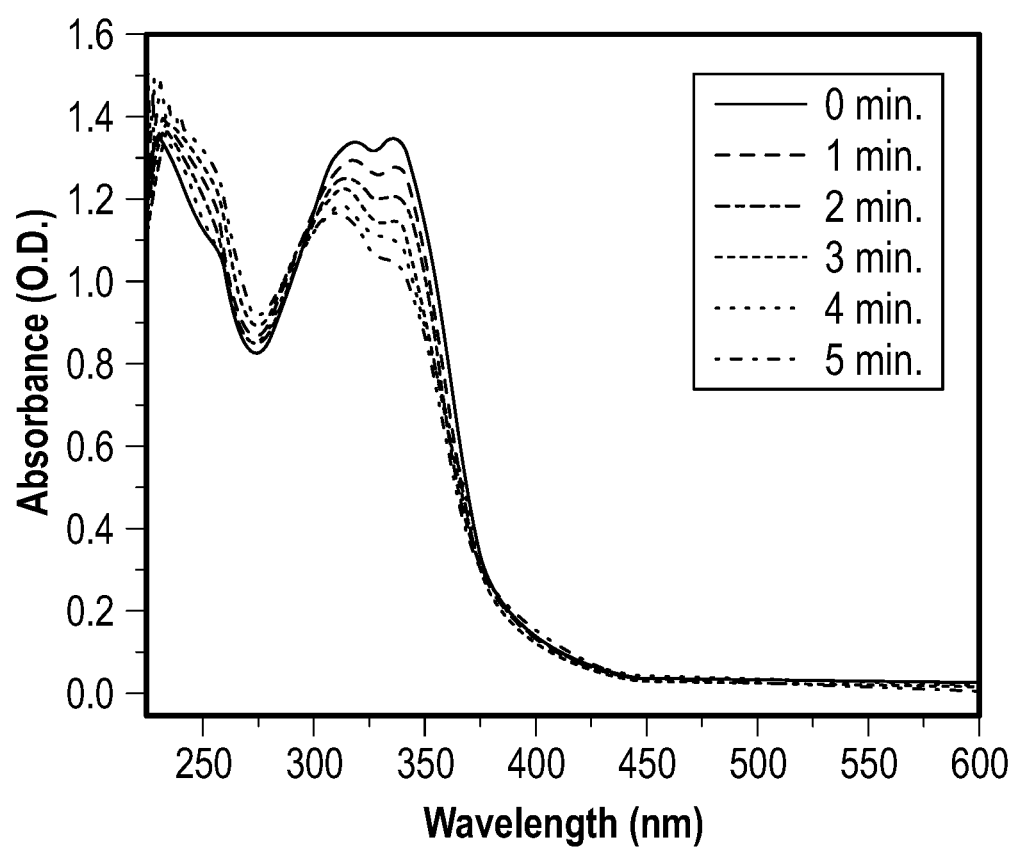
Figure 12A:
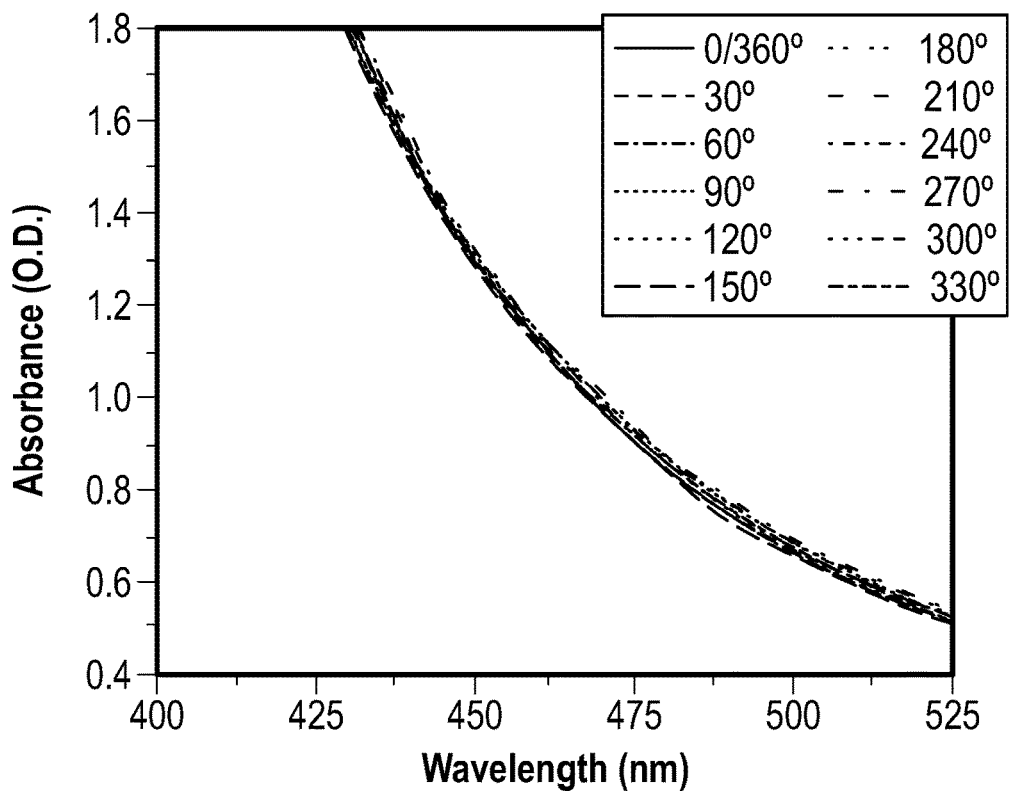
FIG. 12A depicts absorbance spectra of an embodiment of a sensitized polymer thin-film before excitation.
Figure 12B:
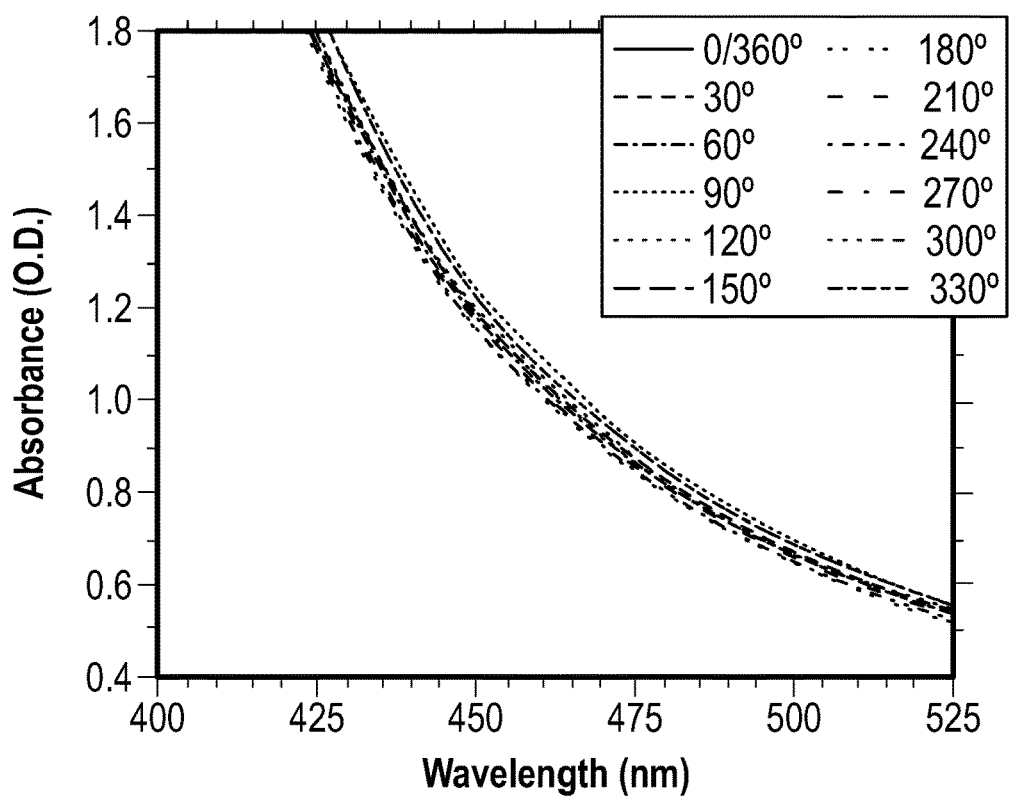
FIG. 12B depicts absorbance spectra of an embodiment of a sensitized polymer thin-film after 1 hour of vertically polarized excitation.

The proposed, mechanism for the photo-induced film bending is depicted in FIG. 2 and the steps were probed using steady-state and time-resolved spectroscopy. In the sensitized film, excitation, internal conversion, and intersystem crossing (steps 1, 2 and 3 in FIG. 2) of FIrPic were known to occur in <500 fs.[24] TET from the triplet excited state of FIrPic to the stilbene moiety was investigated in solution using a Stern-Volmer analysis and the results are shown in FIG. 9A and FIG. 10. FIG. 10 depicts steady-state and time-resolved (inset) phosphorescence of FIrPic with varying concentrations of 6 in DCM ($\lambda_{ex}$=360 nm, $\lambda_{em}$=466 nm, 395 LP).

Figure 9B:
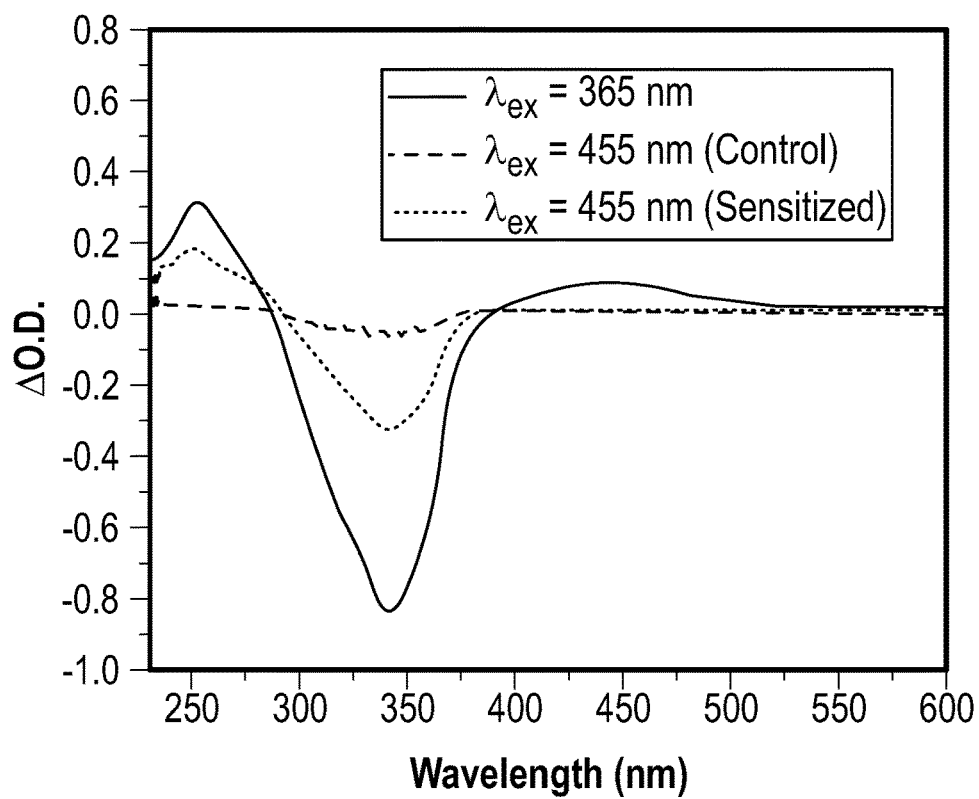
FIG. 9B depicts the change in UV-Vis absorbance of an embodiment of a stilbene monomer in an embodiment of a liquid after irradiation with and without an embodiment of a dopant.
Figure 9C:
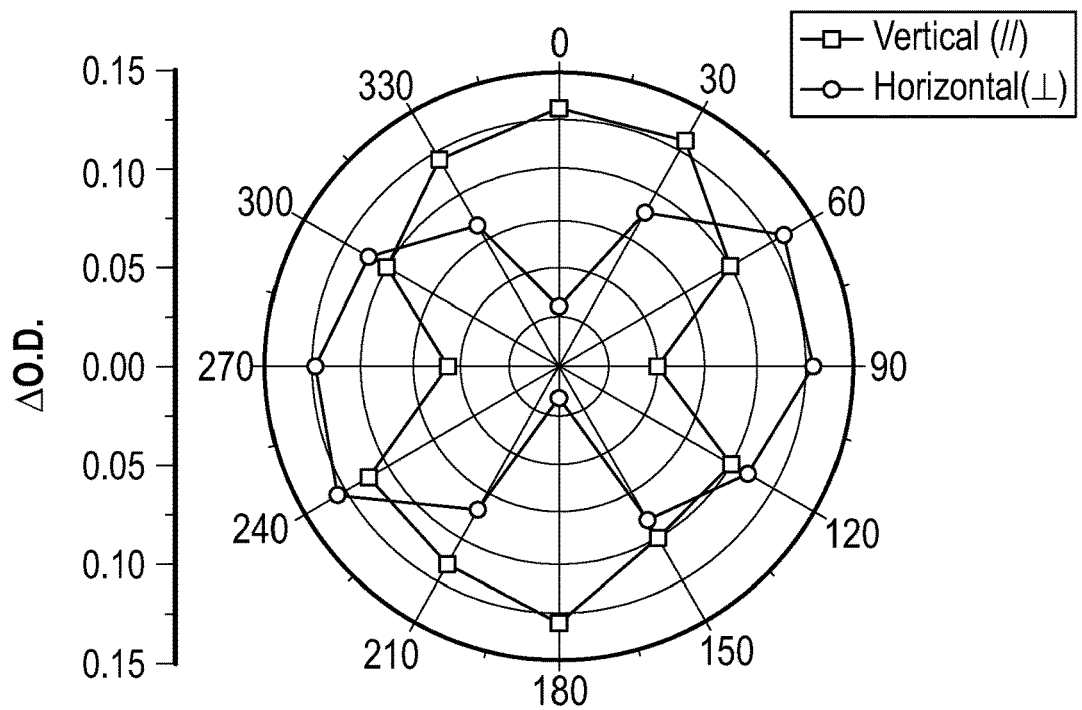
FIG. 9C depicts a polar absorption plot depicting the difference in absorption at 445 nm for embodiments of films before and after irradiation with 445 nm (50 mW cm-2) for 60 minutes.

FIG. 9A depicts a Stern-Volmer plot for the excited state lifetime of FIrPic in DCM (20 µM) versus the concentration of stilbene monomer ($\lambda_{ex}$=360 nm, $\lambda_{em}$=466 nm), and FIG. 9B depicts the change in UV-Vis absorbance of the stilbene monomer (50 µM) in DCM after 5 minutes of irradiation with and without 5.0 µM FIrPic. FIG. 9C depicts a polar absorption plot depicting the difference in absorption at 445 nm for the sensitized polymer films before and after irradiation with 445 nm (50 mW cm$^{-2}$) for 60 minutes (angle reported relative to the long axis of the film).

In this experiment, phosphorescent emission decay for FIrPic in solution was monitored with respect to the concentration of added stilbene monomer. The emission quenching rate constant of 5.4×10$^9$ M$^{-1}$ s$^{-1}$ was in agreement with a diffusion limited energy transfer event in dichloromethane (DCM).[25] No emission was observed from FIrPic in the polymer film further supporting a rapid TET mechanism that was favorable due the proximity of FIrPic and stilbene in the films.

The triplet sensitized trans-to-cis photoisomerization reaction (steps 4 and 5 in FIG. 2) in solution was monitored using UV-Vis spectroscopy, and the results are shown in FIG. 9B, FIG. 11A, FIG. 11B, and FIG. 11C. Change in absorbance over time for 6 ($\lambda_{ex}$=365 nm, 6.4 mW cm$^{-2}$) (FIG. 11A), 6 ($\lambda_{ex}$=455 nm, 12.0 mW cm$^{-2}$) (FIG. 11B), and 6+10 mol % FIrPic ($\lambda_{ex}$=455 nm, 12.0 mW cm$^{-2}$) (FIG. 11C) in DCM.

As expected, direct excitation of the stilbene monomer in DCM with 365 nm light resulted in a decrease in absorption from 280-375 nm and an increase in absorption from 230-280 nm which was consistent with trans-to-cis isomerization of stilbene.[26] However, for a similar solution under 455 nm excitation, no spectral change was observed due to a lack of absorption by stilbene. In contrast, 455 nm excitation of the solution containing stilbene monomer and 10 mol % FIrPic resulted in similar spectra changes as with direct excitation of the monomer. Given that FIrPic is a known triplet sensitizer,[27, 28] and 455 nm (2.72 eV) light is well below the stilbene singlet excited state energy (3.3 eV), these observations further supported FIrPic to stilbene TET followed by a trans-to-cis isomerization reaction from the triplet excited state manifold of stilbene.

As noted above, the sensitized film exhibited a polarization dependent response suggesting that excitation, TET, and isomerization were anisotropic processes. One common means of probing the films polarization dependence was via polarized UV-Vis absorption measurements. For this measurement, the polarized absorption of the sensitized films was measured before and after irradiation with vertically and horizontally polarized 445 nm light (FIG. 11A-FIG. 14). This data is typically plotted in raw absorption units[6] but here, due to the competitive absorption of FIrPic and stilbene, delta absorbance (ΔO.D.) was used and the results are shown in FIG. 9C.

Absorbance spectra of the sensitized polymer thin-film of this example are depicted before excitation (FIG. 12A) and after 1 hour of vertically polarized excitation (FIG. 12B) with $\lambda_{ex}$=445 nm at 50 mW cm$^{-2}$ (spectra were adjacently averaged for 10 points).

Figure 13:
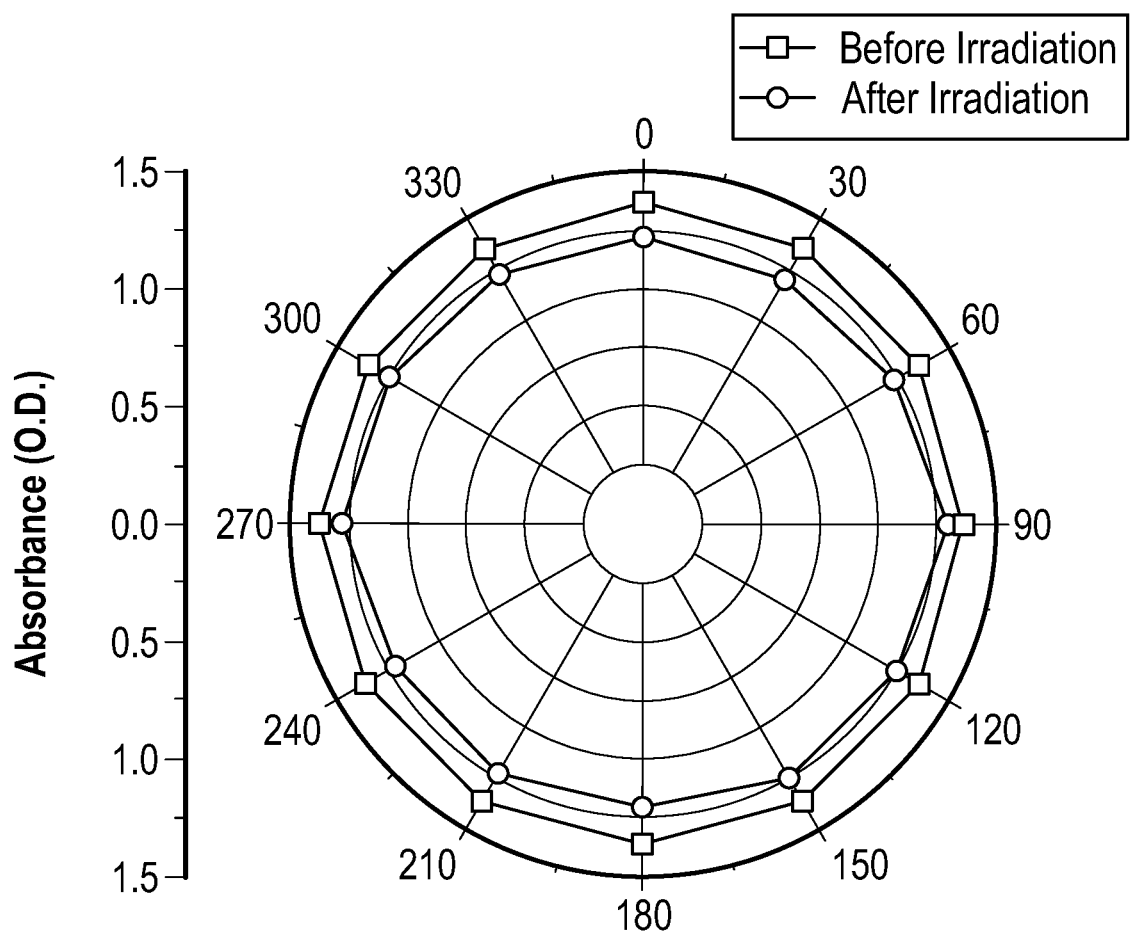
FIG. 13 depicts a polar absorbance plot of an embodiment of a sensitized polymer thin-film before excitation and after 1 hour of vertically polarized excitation.
Figure 14A:
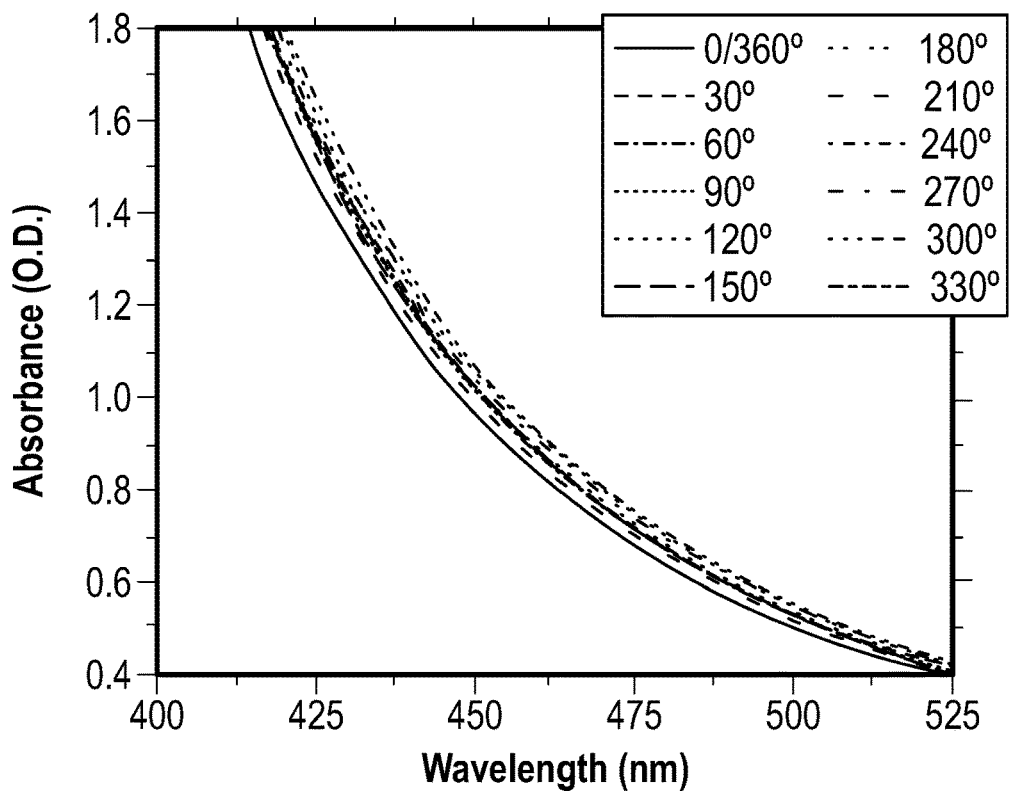
FIG. 14A depicts absorbance spectra of an embodiment of a sensitized polymer thin-film before excitation.
Figure 14B:
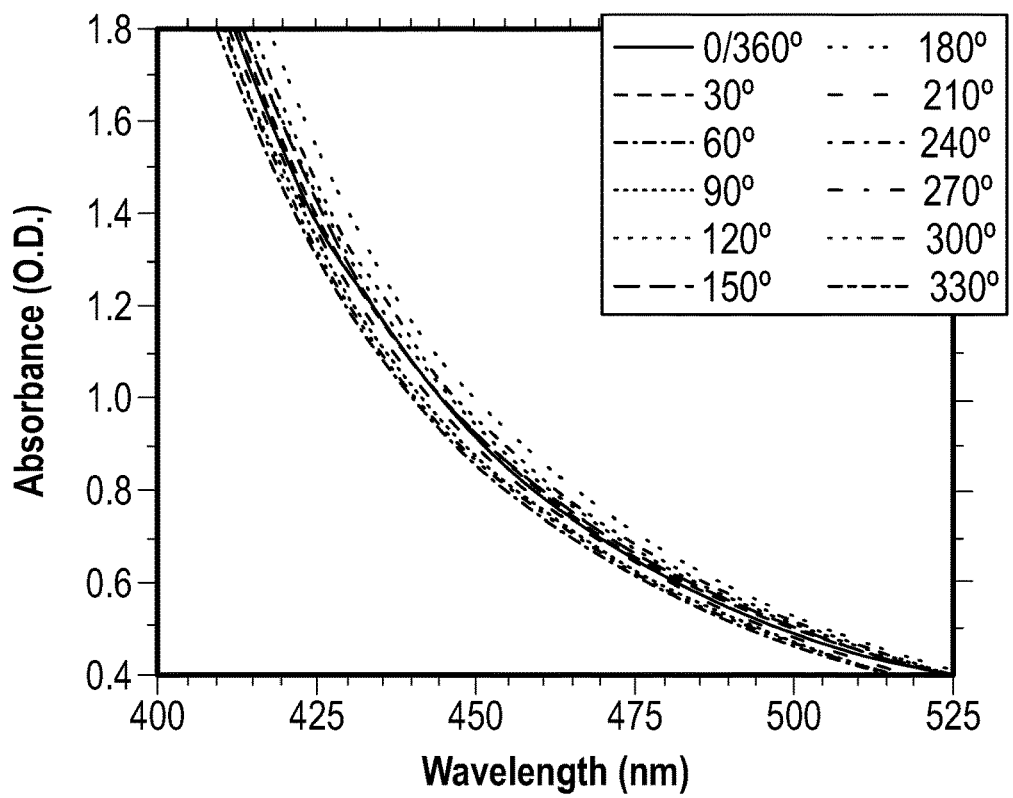
FIG. 14B depicts absorbance spectra of an embodiment of a sensitized polymer thin-film after 1 hour of horizontally polarized excitation.

FIG. 13 depicts a polar absorbance plot of sensitized polymer thin-films of this example before excitation and after 1 hour of vertically polarized excitation with $\lambda_{ex}$=445 nm at 50 mW cm$^{-2}$ ($\Delta_{abs}$=445 nm).

Absorbance spectra of the sensitized polymer thin-film of this example are depicted before excitation (FIG. 14A) and after 1 h of horizontally polarized excitation (FIG. 14B) with $\lambda_{ex}$=445 nm at 50 mW cm$^{-2}$ (spectra were adjacently averaged for 10 points).

Figure 15:
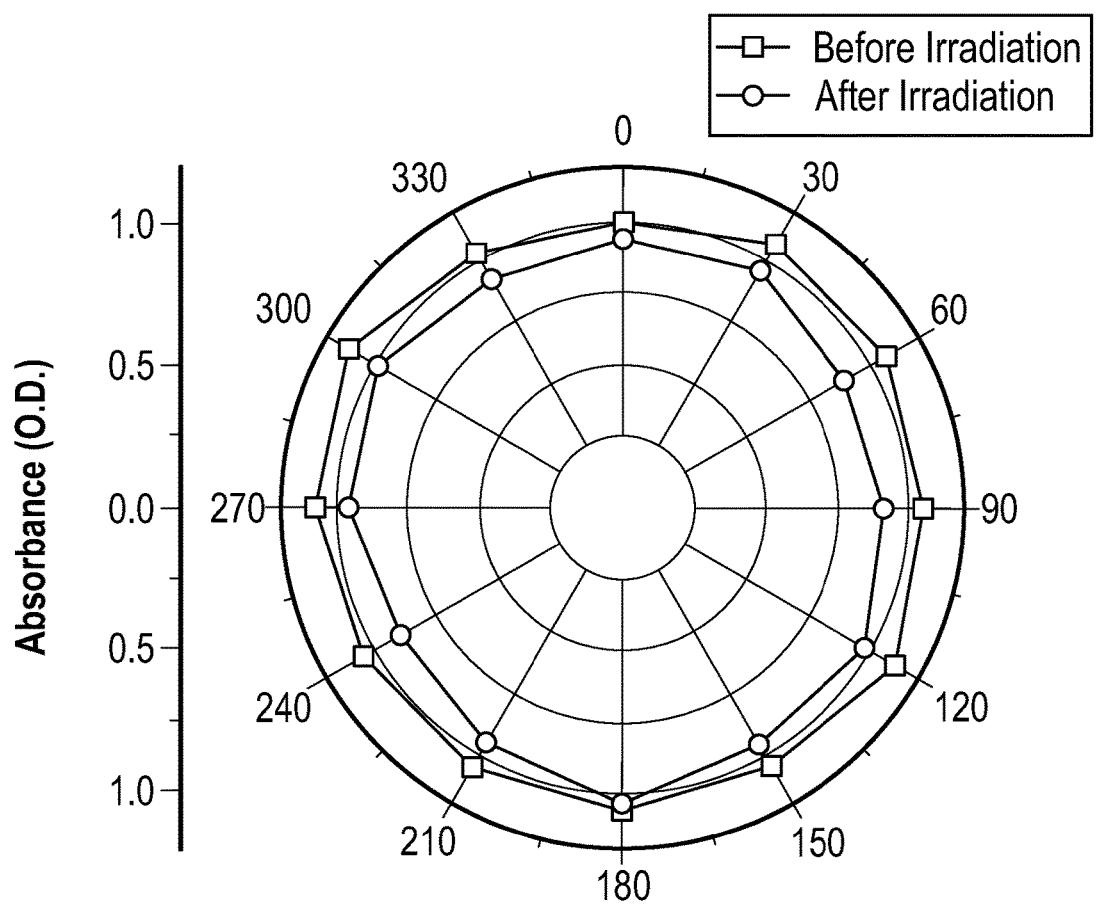
FIG. 15 depicts a polar absorbance plot of an embodiment of a sensitized polymer thin-film before excitation and after 1 hour of horizontally polarized excitation.

FIG. 15 depicts a polar absorbance plot of sensitized polymer thin-films of this example before excitation and after 1 hour of horizontally polarized excitation with $\lambda_{ex}$=445 nm at 50 mW cm 2 ($\lambda_{abs}$=445 nm).

The absorption for the as prepared polymer film was the same absorption in all directions. However, following irradiation with polarized 445 nm light, the films exhibited the largest ΔO.D. along the axis of excitation. That is, vertical excitation induced the largest ΔO.D. at 0° and 180°, and at 90° and 270° for perpendicular excitation. Collectively, these results supported an anisotropic TET event followed by trans-cis-trans isomerization and realignment of the stilbene units. Orientation dependent TET was not that surprising given the orbital overlap that was required for Dexter energy transfer to occur.[29] Interestingly, it was believed that the absorption of FIrPic remained isotropic after irradiation. This observation suggested that either 1) the FIrPic molecules were immobile in the film, or more likely, 2) that FIrPic was free to rotate but TET occurred much faster than rotation and thus polarization was retained.

In summary, a stilbene-based polyimide polymer film was synthesized and doped with an iridium(III) cyclometallated triplet sensitizer molecule (FIrPic). In contrast to the unsensitized film that was unperturbed under 445 nm irradiation, the sensitized film exhibited a polarization dependent photomechanical response. More specifically, the film bent towards and away from the vertically and horizontally polarized light source, respectively. Spectroscopic measurements supported a stepwise mechanism involving 1) excitation of FIrPic sensitizers followed by internal conversion and intersystem crossing to the triplet excited state, 2) triplet energy transfer from FIrPic to the stilbene monomer, 3) trans-cis-trans isomerization from the triplet excited state of stilbene, and 4) reorientation of the stilbene monomers resulting in a bulk contraction or expansion at the surface of the film. Particularly notable was that although the excitation and isomerization events occurred on different species, a polarization dependent response was still observed indicating that anisotropic excited states were retained through the triplet energy transfer event.

Collectively, these results were notable in that this was the first demonstration of a stilbene-based photomechanical polymer, and that the low energy triplet of stilbene could be utilized to elicit a mechanical response. More broadly, this example demonstrated that triplet sensitization could serve as a new, low energy light harvesting mechanism in photomechanical polymers.

Example 2—Materials, Synthesis, and Analysis

Materials: 4-fluorostyrene and 4,4'-oxydiphthalic dianhydride (Tokyo Chemical Industry), 1-bromo-4-nitrobenzene, triphenylphosphine, triethylamine, palladium(II) acetate, bisphenol A, potassium tert-butoxide, and tin(II) chloride (Sigma-Aldrich) were purchased from their respective suppliers, in parentheses, and used as received. All other reagents and solvents (analytical reagent grade) have been purchased and used without further purification from Alfa Aesar.

Stilbene Monomer Synthesis:

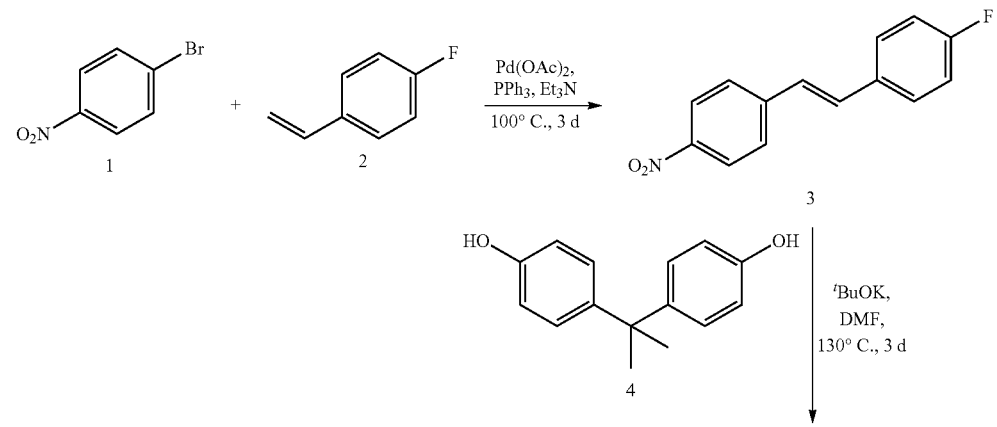

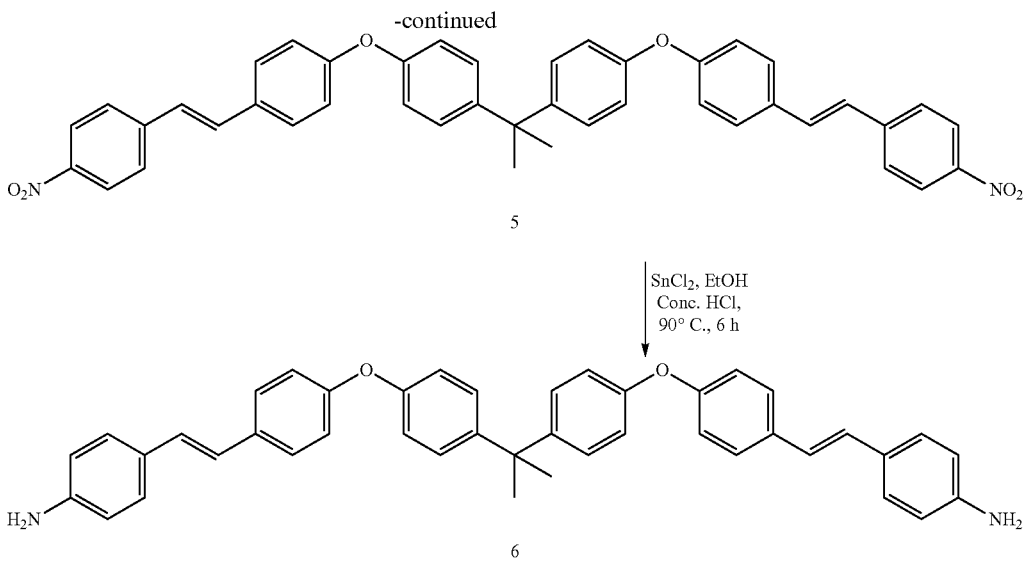

1-Fluoro-4-(4-nitrostyryl)benzene (3) (see, e.g., Das, R. K. et al. *Chem. Eur. J.* 2010, 16 (48), 14459-14468): 4-fluorostyrene (1, 5.0 gm, 40.9 mmol), 4-bromo-nitrobenzene (2, 10.0 gm, 50 mmol), palladium acetate (1.4 gm, 5 mmol), dry triethylamine (5.5 gm, 40.9 mmol) and triphenylphosphine (10 gm, 40 mmol) were added into a 250 mL three-neck round bottom flask under $N_2$ gas. The reaction mixture was allowed to stir at 100° C. for 72 h. After completion of the reaction, it was diluted with 300 mL dichloromethane and was filtered. The organic layer was washed 3 times with water followed by brine and dried with anhydrous sodium sulfate. Solvent was evaporated under reduced pressure and purified by column chromatography with hexane/ethylacetate=9:1 as the eluent to get an orange solid and a yield of 60%. $^1$H NMR (400 MHz, $CDCl_3$): δ (ppm) 8.25 (2H, d, J=8.0 Hz); 7.65 (2H, d, J=8.0 Hz); 7.56 (2H, dd, J=8.0 Hz); 7.24 (1H, s); 7.15-7.05 (3H, m).

4,4'-(propane-2,2-diyl)bis(4-(4-nitrostyryl)phenoxy)benzene) (5) (see, e.g., Bizier, N. P. et al. *J. Org. Chem.* 2013, 78 (12), 5987-5998): In a reaction flask under $N_2$ gas, 3 (4.8 gm, 20 mmol), bisphenol A (4, 2.2 gm, 10 mmol), and dry DMF (100 mL) were added. The reaction was started with the addition of KOtBu (2.2 gm, 20 mmol). The reaction mixture was stirred in an oil bath at 130° C. for 72 h. The reaction was removed from the oil bath and quenched by dilution with $CH_2Cl_2$ and 1 M HCl to neutralize the base. The layers were separated, and the aqueous phase was extracted with $CH_2Cl_2$ (3×80 mL). The combined organic layers were washed with $H_2O$ (100 mL) and dried over anhydrous sodium sulfate. The solvent was removed under reduced pressure to give a red-orange solid. Purification by silica gel flash chromatography (hexanes/ethylacetate=8:2) was done to yield 50% of 5. $^1$H NMR (400 MHz, $CDCl_3$): δ (ppm) 8.24 (2H, d, J=8.0 Hz); 7.64 (2H, d, J=8.0 Hz); 7.54 (2H, d, J=8.0 Hz); 7.26 (2H, d, 8.0 Hz); 7.12-6.95 (6H, m); 2.03 (6H, s).

4,4'-((Propane-2,2-diylbis(4,1-phenylene)bis(Oxy)bis(4,1-phenylene))bis(ethylene-2,1-diyl))dianiline (6) (see, e.g., Hahm, S. G. et al. *J. Phys. Chem. B* 2008, 112 (16), 4900-4912): 5 (5.00 g, 7.4 mmol) and $SnCl_2$ (6.6 g, 35 mmol) were dissolved in a mixture of ethanol (80 mL) and hydrochloric acid (36% concentration, 24 mL). The reaction mixture was stirred for 1 h at room temperature, followed by refluxing for 6 h. Thereafter, the reaction solution was poured into ice and adjusted to pH 8 with sodium hydroxide solution. After extraction with ethyl acetate four times, the combined organic layer was dried over anhydrous sodium sulfate, followed by evaporation under reduced pressure to obtain a crude brown-yellow solid. The diamine was purified by column chromatography with hexane/ethylacetate=18:2 and recrystallized in ethanol to obtain a 52% yield of 6. ESI-MS (m/z): Calculated for $C_{43}H_{38}N_2O_2$—614.29, Observed—613.34 $[M-1]^+$; $^1$H NMR (400 MHz, $CDCl_3$): δ (ppm) 7.45 (2H, d, J=8.0 Hz); 7.35 (2H, d, J=8.0 Hz); 7.23 (2H, d, J=8.0 Hz); 7.00 (2H, d, 12.0 Hz); 6.97-6.92 (4H, m); 6.70 (2H, d, 8.0 Hz); 3.77 (4H, s); 1.71 (6H, s). $^{13}$C NMR (150 MHz, $CDCl_3$): δ (ppm) 146.02, 145.54, 128.03, 127.82, 127.61, 127.34, 124.40, 119.03, 118.18, 115.23, 42.13, 31.05.

Iridium(III)bis[2-(4,6-difluorophenyl)pyridinato-C2,N] (picolinato) Synthesis: The iridium sensitizer (FIrPic) was synthesized according to a known procedure (see, e.g., You, Y. et al. *J. Am. Chem. Soc.* 2005, 127 (36), 12438-12439).

Polymerization Reaction and Film Preparation: 6 (25 mg, 0.041 mmol) and DMAc (0.5 mL) were added to a 10 mL three-necked flask equipped with a magnetic stirrer, nitrogen inlet, and outlet and stirred under dry nitrogen at room temperature for 30 min. 4,4'-oxydiphthalic dianhydride (12.6 mg, 0.041 mmol) and FIrPic (10 mol %) was then added. The dark red, viscous poly(amic acid) solution was obtained at room temperature after 24 h. This solution was diluted with DMAc (0.67 mL), poured onto a clean VWR microglass slide (25×75 mm), followed by vacuum evaporation of DMAc at 50° C., and heat-treated at 100° C./2 h, 150° C./2 h, 175° C./1 h, 200° C./2 h and 250° C./1 h to form imidized polymers. The film thicknesses ranged from 20-100 μm and were measured with a Mitutoyo 293-340-30 Digimatic 0-1"/25.4 MM Fast Measure IP65 Digital Micrometer Ratchet Stop Thimble. Samples with thicknesses of 25±10 μm were used for mechanical experiments (see, e.g., Wang, D. H. et al. *Macromolecules* 2014, 47 (2), 659-667).

Absorption Spectra: Data were recorded on an Agilent 8453 UV-visible photo diode array spectrophotometer. Solution samples were done using a quartz cuvette in DCM and thin film absorption spectra were obtained by placing polymer films perpendicular to the detection beam path. Polar absorption measurements used the same instrument but first passed the excitation source through a Glan-Taylor polarizer (ThorLabs, 350 nm-2.3 μm) before hitting the sample.

Nuclear Magnetic Resonance (NMR): $^1$H were recorded using Bruker 400 MHz spectrometer and $^{13}$C NMR spectra were recorded on a Bruker 600 MHz spectrometer at room temperature. Chemical shifts for protons are reported in parts per million (ppm) relative to the respective residual solvent peaks. All NMR spectra were processed using MNOVA.

High-Resolution Mass Spectrometry (HR-MS): High-resolution mass spectra of 6 was recorded using an Agilent 6230 TOF MS in positive mode (+ESI).

Attenuated Total Reflectance-Fourier Transform Infrared Spectroscopy (ATR-FTIR): Attenuated total reflectance infrared spectra were recorded using a Bruker Alpha FTIR spectrometer (SiC Glowbar source, DTGS detector) with a Platinum ATR quickSnap sampling module (single reflection diamond crystal). Spectra were acquired from 900 to 1900 cm$^{-1}$ at a resolution of 4 cm$^{-1}$. All ATR-IR spectra are reported in absorbance with a blank versus atmosphere.

Solid-State Absorption: The spectra were collected on thin-film samples at room temperature, using an Edinburgh FLS980 spectrometer with the integrating sphere accessory. Light output from a housed 450 W Xe lamp was passed through a single grating (18001/mm, 250 nm blaze) Czerny-Turner monochromator and then into the integrating sphere containing the sample. The output from the integrating sphere was passed through a single grating (1800 L/mm, 500 nm blaze) Czerny-Turner and finally detected by a Peltier-cooled Hamamatsu R928 photomultiplier tube. Synchronous spectral scans were performed with both excitation and emission monochromators, with zero wavelength offset, stepping through the preset spectral range. Absorbance was then calculated using Edinburgh's F900 software package.

Steady-state Emission: Emission spectra were recorded at room temperature using an Edinburgh FLS980 fluorescence spectrometer. The samples were excited using the output from a housed 450 W Xe lamp/single grating 1800 λ.mm$^{-1}$, 250 nm blaze Czerny-Turner monochromator, passed through the appropriate long-pass filter, and detected by a Peltier-cooled Hamamatsu R928 photomultiplier tube. Oxygen-sensitive samples were prepared in a glovebox under a $N_2$ atmosphere.

Time-Resolved Emission: Time-resolved emission traces were acquired using the same spectrometer as the steady-state emission measurements. The emission decay traces were acquired using either time-correlated single-photon counting (TCSPC; 1024 channels; 20 μs window) with data collection for 5000 counts for lifetime measurements of FIrPic. TCSPC excitation was provided by an Edinburgh EPL-360 ps pulsed light emitting diode (360±10 nm, pulse width 892 ps) operated at 10 MHz.

Lifetime determination: Solution emission decay kinetics were fit with a single exponential function $y=A_1 e^{-kx}+y_0$ using the Edinburgh software package.

Thermogravimetric Analysis (TGA): TGA was performed on a TA instruments TGA 550 by heating samples at a rate of 5° C./min under Ar (40 mL/min flow rate) using a platinum TGA pan.

Differential Scanning calorimetry (DSC): Second heating DSC analysis was performed on a TA Instruments Model Q2000 with a model RCS90 refrigerated cooling system. Samples were cycled between 25° C. and 250° C. under $N_2$ (50 mL/min flow rate) at a rate of 10° C./min.

Polymer Film Thermal Imaging: Thermal infrared imaging measurements were done using a FLIR A655 sc series camera (25°; 50 Hz). Data was analyzed using the FLIR ResearchIR software and data points were taken along the long-axis of the film across a distance of 30 mm after 30 seconds of exposure.

Figure 16:
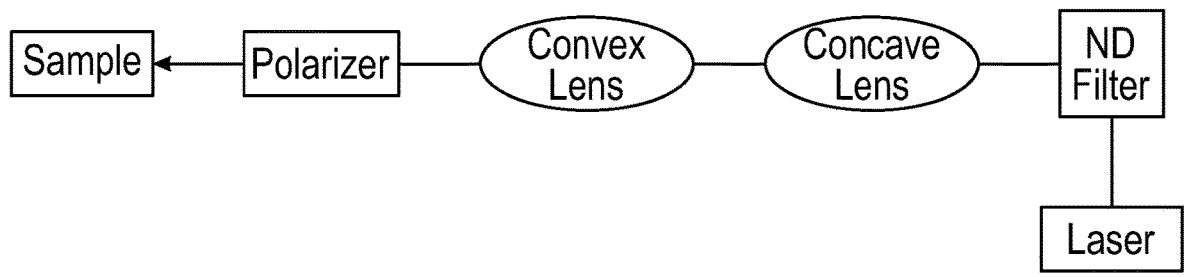
FIG. 16 depicts an embodiment of an experimental setup for bending experiments.

Film Mechanical Demonstrations and Modelling (bend tests): A free bending setup was constructed and a visual depiction can be seen in FIG. 16. The setup consisted of a Aixiz 445 nm Laser [AIX-445-A], a set of neutral density filters, a ThorLabs 025 mm FL25 mm N-BK7 Plano-Concave Lens, a ThorLabs 050.8 mm FL100 mm N-BK7 Plano-Convex Lens (Uncoated), a Newport PR-550 broadband polarization rotator, and the clamp for the specimen (from right to left). The laser power density was measured with a ThorLabs PM100 USB Power Meter and ThorLabs S121C—Standard Photodiode Power Sensor. Motion pictures and images were collected via a DSLR Sony camera, and a MATLAB routine analyzing multiple frames from the real-time bending video was created which utilized the law of cosines to determine the changing angle with respect to time (FIG. 7).

The invention claimed is:
1. A composition comprising:
   a photopolymer comprising at least one stilbene-based monomer, and
   a dopant dispersed in the photopolymer;
   wherein the dopant comprises a triplet excited state sensitizing dopant; and
   wherein a mole ratio of the stilbene-based monomer to the dopant in the composition is about 1:0.01 to about 1:0.5.
2. The composition of claim 1, wherein the photopolymer is a polyimide photopolymer.
3. The composition of claim 1, wherein the at least one stilbene-based monomer has the following structure when unpolymerized:

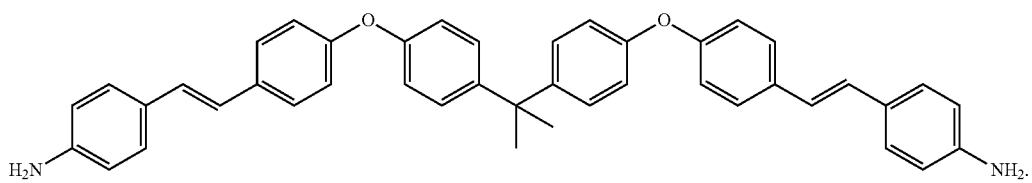

4. The composition of claim 1, wherein the photopolymer has the following structure:

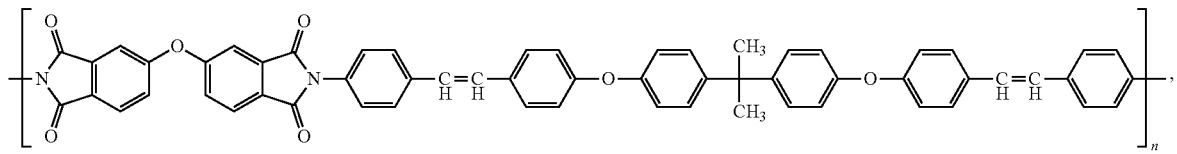

wherein n is 2 to 100,000.

5. The composition of claim 1, wherein the dopant comprises a quantum dot.

6. The composition of claim 1, wherein the dopant comprises an iridium(III) cyclometallated sensitizer.

7. The composition of claim 6, wherein the dopant comprises bis[2-(4,6-difluorophenyl)pyridinato-$C^2$,N](picolinato)iridium(III).

8. The composition of claim 1, wherein the dopant is substantially uniformly dispersed in the polymer.

9. The composition of claim 1, wherein the dopant is present in the composition at an amount of about 1 mol % to about 20 mol %, relative to the at least one stilbene-based monomer.

10. The composition of claim 1, wherein the composition is in the form of a film.

11. The composition of claim 10, wherein the film has a thickness of about 15 micrometers to about 40 micrometers.

12. A method of eliciting a photomechanical response, the method comprising:

providing the composition of claim 1; and irradiating the composition with one or more wavelengths of electromagnetic radiation effective to elicit the photomechanical response of the composition.

13. The method of claim 12, wherein the photomechanical response comprising a bending of the composition, a constriction of the composition, or a combination thereof.

14. The method of claim 12, wherein the one or more wavelengths of electromagnetic radiation comprise at least one wavelength within the visible spectrum.

15. The method of claim 14, wherein the one or more wavelengths of electromagnetic radiation are from about 400 nm to about 450 nm.

16. The method of claim 12, wherein the photomechanical response occurs via a triplet excited state mechanism.

17. A composition comprising:

a photopolymer, and a dopant dispersed in the photopolymer;

wherein the photopolymer comprises a stilbene-based monomer, the stilbene-based monomer having the following structure when unpolymerized—

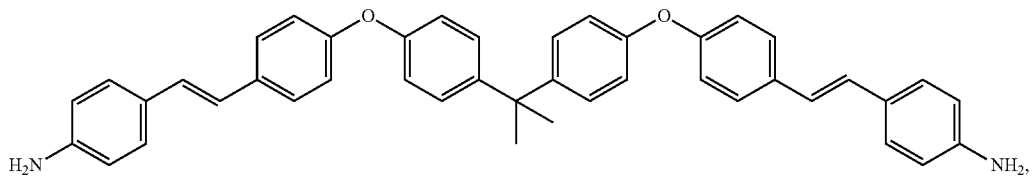 [SMILES: CC(C)(c1ccc(Oc2ccc(/C=C/c3ccc(N)cc3)cc2)cc1)c1ccc(Oc2ccc(/C=C/c3ccc(N)cc3)cc2)cc1]

and wherein the dopant comprises an iridium(III) cyclometallated sensitizer.

18. The composition of claim 17, wherein a mole ratio of the stilbene-based monomer to the dopant in the composition is about 1:0.01 to about 1:0.5.

19. The composition of claim 17, wherein the composition is in the form of a film.

20. A compound of the following structure:

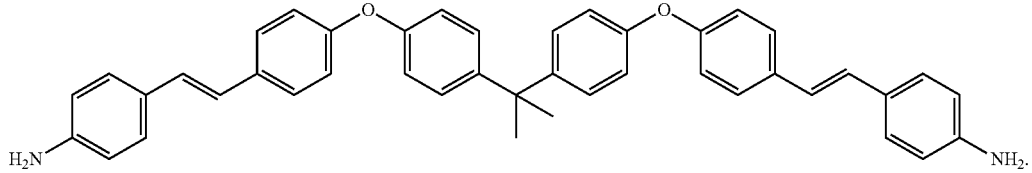 [SMILES: CC(C)(c1ccc(Oc2ccc(/C=C/c3ccc(N)cc3)cc2)cc1)c1ccc(Oc2ccc(/C=C/c3ccc(N)cc3)cc2)cc1]

* * * * *